(12) United States Patent
Shepard

(10) Patent No.: US 6,453,444 B1
(45) Date of Patent: Sep. 17, 2002

(54) METHOD FOR EXTRACTION OF INDUCTANCES IN INTEGRATED CIRCUITS

(75) Inventor: Kenneth L. Shepard, Ossining, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 09/496,805

(22) Filed: Feb. 2, 2000

Related U.S. Application Data

(60) Provisional application No. 60/118,246, filed on Feb. 2, 1999.

(51) Int. Cl.[7] ............................................... G06F 17/50
(52) U.S. Cl. ......................................................... 716/2
(58) Field of Search ........................... 330/52; 716/1–21

(56) References Cited

U.S. PATENT DOCUMENTS 5,485,118 A * 1/1996 Chick ........................... 330/52

* cited by examiner

Primary Examiner—Matthew Smith
Assistant Examiner—Thuan Do
(74) Attorney, Agent, or Firm—Baker Botts L.L.P.

(57) ABSTRACT

Disclosed is an approximate inductance extraction method that can be practically applied to full-chip inductance extraction of complex integrated circuits. The method results in a positive semi-definite inductance matrix and achieves sparsity of the inductance matrix by breaking inductive couplings between power-ground lines and signal lines and by using a set of geometry based decomposition rules to eliminate insignificant coupling interactions between signal lines. By taking advantage of the ever-present availability of power-ground lines as high frequency current returns while preserving inductive coupling between signal lines, the disclosed method has demonstrated higher efficiency and accuracy than other inductance matrix sparsification techniques.

6 Claims, 23 Drawing Sheets

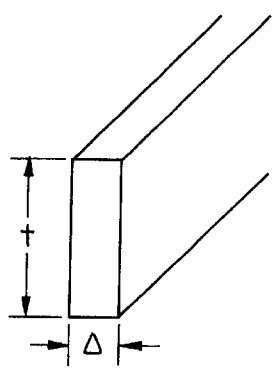
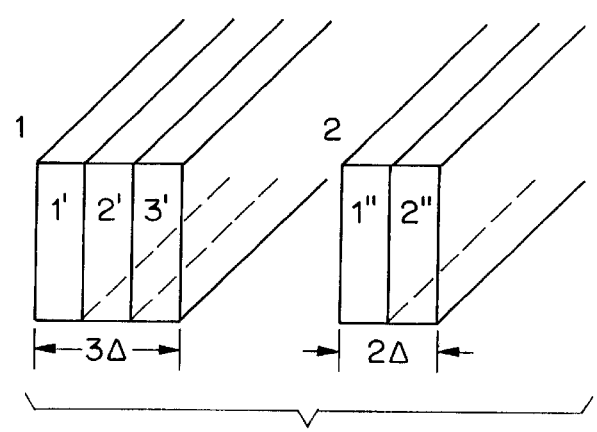
FIG. 7A    FIG. 7B
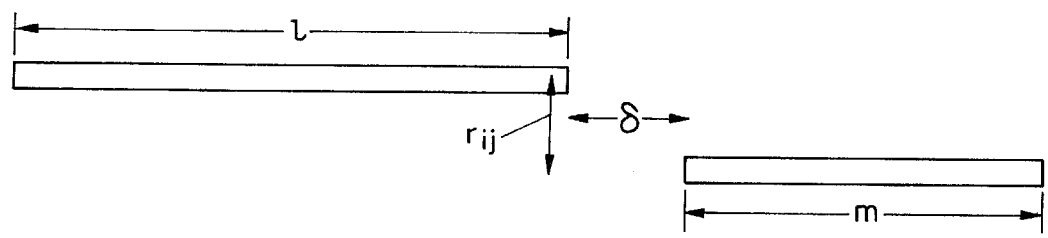
FIG. 8

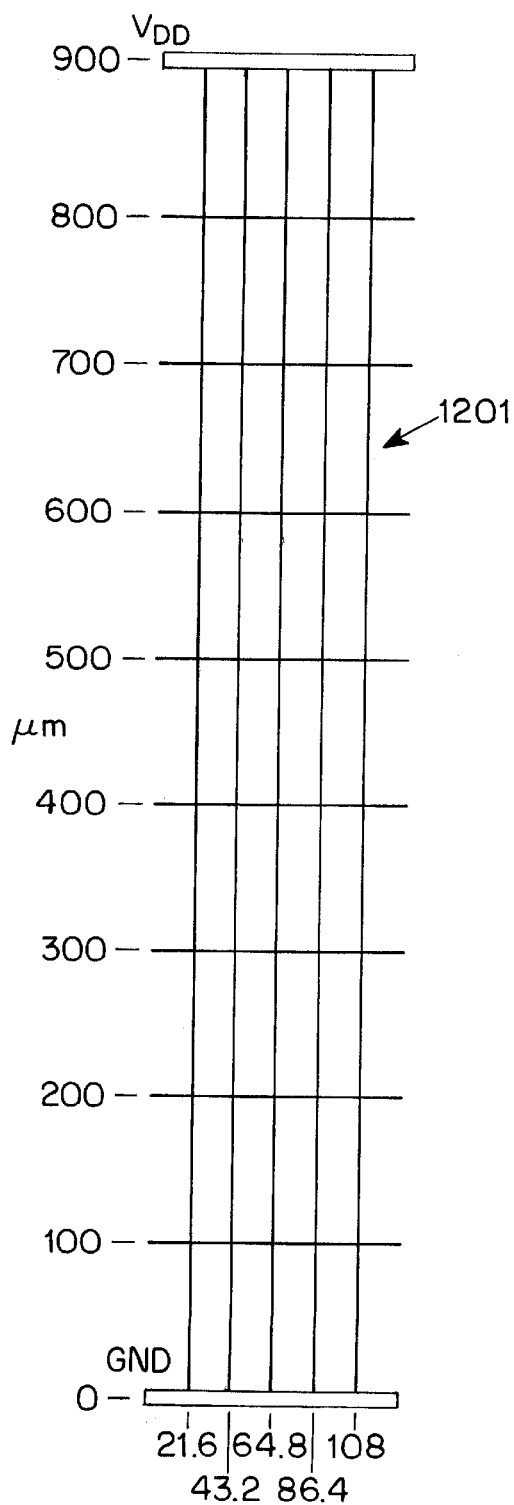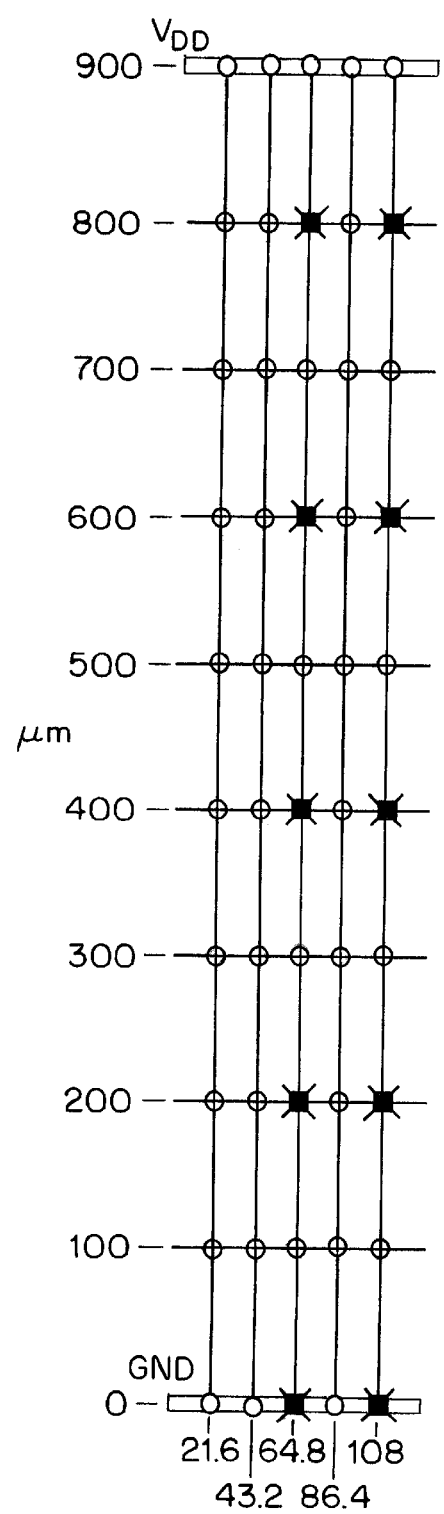
FIG. 12B
FIG. 12C

METHOD FOR EXTRACTION OF INDUCTANCES IN INTEGRATED CIRCUITS

CROSS-REFERENCE TO RELATED APPLICATION

The present application claims priority based on U.S. provisional patent application Ser. No. 60/118,246 filed on Feb. 2, 1999.

BACKGROUND OF INVENTION

The present invention relates to modeling of integrated circuits, and, more particularly, to the extraction of inductances of the interconnections of integrated circuits for the purpose of simulating such circuits.

In the design of integrated circuits, simulation of circuit function and performance has become an indispensable part of the design process. Simulation is carried out using a computer and simulation software that accepts models of the devices and interconnections of the circuit being simulated. It is obvious that the reliability of the simulation of an integrated circuit depends on the accuracy of the models that are used by the simulation software.

With the design of more densely packed VLSI circuits, the interconnection lines of such circuits have smaller cross sections and are packed closer together. As a result, RC delays of the interconnect wires have become an important limitation on circuit performance, and capacitive coupling between interconnect wires has become a significant source of on-chip noise. In addition, increasing chip densities and switching speeds have imposed a much heavier burden on the power and ground distribution lines to supply sufficient current to switching circuits, and the ΔI noise caused by heavy transient current demands of switching circuits is becoming a more serious problem.

In an effort to overcome these problems, next generation technologies can be expected to make increasing use of low-resistivity metals, such a copper, and low dielectric constant insulators. Chip designers routinely make power and ground distribution lines using wide, thick upper-level metal and make long signal lines in the same way to reduce resistance. While these improvements reduce RC delays of signal lines and reduce ΔI noise on power and ground lines, it has now become important to take into account the inductance and inductive coupling of signal lines in simulating the performance of an integrated circuit.

Inductance and inductive coupling have become important in timing and noise analysis of signal lines in several ways. Firstly, inductance must be included in the model of the circuit to accurately predict rise and fall times, as well as delays in timing analysis. Secondly, overdriving an inductive interconnect line can result in an under damped ringing response. Thirdly, inductive coupling, along with capacitive coupling, can be a significant source of noise on a "quiet" signal line that runs close to another signal line carrying a signal having high frequency components.

Printed circuit board (PCB) and package designers have long been concerned about signal line inductances and return paths for currents in such inductances and typically provide discrete ground and power supply planes to control signal line impedance. Because inductance has not been of concern until recently for on-chip wires in digital VLSI circuits, designers have largely viewed such on-chip signal wires as single-ended distributed RC lines without concern for current returns. Power and ground distribution lines have been designed independently to satisfy power and ground requirements of switching circuits and to minimize the ΔI noise. When inductance is taken into account in modeling high frequency integrated circuits, the layout of the power and ground distribution lines has an important effect on the response of inductive signal lines in the circuit.

The conventional approach to designing the layout of power and ground distribution lines in a VLSI integrated circuit chip is to create an on-chip grid. Referring to FIG. 1A, there is shown an illustrative cross section of an integrated circuit chip having five levels of conductors designated by M1, M2, M3, M4 and LM. The power and the ground distribution network, which is shown in black, have lines extending in a vertical direction (i.e., parallel to one edge of a rectangular chip) in conductor levels M1, M3 and LM, and lines extending in a horizontal direction (i.e., parallel to the orthogonal edge of the rectangular chip) in conductor levels M2 and M4.

Turning to FIG. 1B, there is shown an illustrative plan view of the power and ground distribution network in the form of a grid. At high frequencies, the power supply and ground are sufficiently decoupled so that the power distribution lines and the ground distribution lines serve equally well in providing return paths for signal line inductances.

Referring to FIG. 1C, there is shown a cross-section view of the design for power and ground distribution used in the Digital Equipment Corporation Alpha 21264 chip, in which two entire metal levels 108 and 109 are dedicated to the distribution of power and ground by providing what amounts to a power plane and a ground plane in a manner conventional to PCB design. Openings are made in these power and ground planes to provide vias for connecting signal lines on opposite sides of the power and ground planes. While the design approach of FIG. 1C provides more control and predictability in signal line, and power and ground line inductances, it is generally considered inefficient usage of the chip metallization levels because wiring resources are always scarce in VLSI circuit chips. Therefore, the grid layout for power and ground distribution, which does not provide well defined return paths for signal line inductances, is the one that is commonly used in high frequency VLSI circuit chips.

To allow equivalent circuits to be developed in complex integrated circuits in which return paths for signal line inductances are not known, the calculation of partial inductances is traditionally used. The partial inductance technique, which assigns portions of a loop inductance to segments along the loop, is described in E. B. Rosa, "The Self and Mutual Inductance of Linear Conductors," Bulletin of the National Bureau of Standards, 4, pp. 301–344, 1908. A book by F. Grover, entitled "Inductance Calculations: Working Formulas and Tables," published by Dover, New York, 1962 provides a comprehensive tabulation of formulae for partial inductances and partial mutual inductances for conductors of different geometries. Applying partial inductances to the modeling of complex multi-conductor networks was formalized by Ruehli with the development of partial-element equivalent circuits (PEEC), as described in A. E. Ruehli, "Inductance Calculations in a Complex Integrated Circuit Environment," IBM Journal of Research and Development, 16(5), pp. 470–481, 1972.

In the partial inductance approach, signal lines, power distribution lines and ground distribution lines are treated equivalently, therefore resulting in a very large, densely-coupled inductance matrix representation of the interconnection network. In the partial inductance matrix representation of circuit inductances, a matrix is derived that has as its main diagonal elements the partial self inductances of all signal lines, power distribution lines and ground distribution lines of a circuit, and has as its off-diagonal elements the partial mutual inductances between each one of the signal lines, power distribution lines and ground distribution lines with every other one of such lines in the circuit. Thus an inductance matrix provides a convenient representation of the inductances of a circuit and the elements of the matrix may be used by a circuit simulation program together with circuit resistance and capacitance to model the performance of the circuit. However, the complete inductance matrix of a VLSI circuit derived using the partial inductance technique is so large as to be impractical for use in the simulation of the circuit. Moreover, such a large inductance matrix representing every wire coupled to every other wire in the circuit is not necessary to provide sufficiently accurate circuit simulations.

One approach to make the inductance matrix sparse is to truncate the matrix by discarding those terms that are below a certain threshold. However, truncation does not guarantee that the resulting truncated inductance matrix will be positive semi-definite. An inductance matrix L is positive semi-definite if for an I $$I^T L I \geq 0, \quad (1)$$

where I is a current vector having as elements the current passing through each signal line, and each power and ground distribution line. The condition of positive semi-definiteness signifies that the magnetostatic energy in the circuit is greater than or equal to zero, a condition which must be met by all physically realizable circuits. Using a truncated non-positive-definite inductance matrix in simulating a circuit will result in instability of the simulation, as described in Zhijiang He, Mustafa Celik, and Lawrence Pileggi, SPIE: "Sparse Partial Inductance Extraction," Proceedings of the $34^{th}$ Design Automation Conference, pp. 137–140, Anaheim, Calif., June 1997.

As an alternative to simple truncation, another proposed technique to render the inductance matrix sparse is to associate with every signal line segment, and every power and ground distribution line segment a distributed current return in the form of a shell located a distance $r_0$ away from the segment. According to this approach, segments spaced more than a distance $r_0$ apart have no inductive coupling. This shell technique is described in B. Krauter and L. T. Pileggi, "Generating Sparse Partial Inductance Matrices with Guaranteed Stability," Proceedings of the International Conference on Computer-Aided Design, pp. 45–52, 1995. The shell technique has also formed the basis for approximating loop inductance bounds, as described in Zhijiang He and Lawrence T. Pileggi, "A Simple Algorithm for Calculating Frequency-Dependent Inductance Bounds," Proceedings of the IEEE Custom Integrated Circuits Conference, pp. 199–202, 1998.

However, the shell technique has the problem in that the value of $r_0$ that must be used to achieve a desired accuracy depends on the interconnect topology, the connectivity of the interconnect wires in question, and the particular interconnect wire or coupling being considered. There is no way of determining a priori the value of $r_0$ required to achieve tolerable accuracy This leads to complicated schemes in which the value of $r_0$ is dynamically chosen based on accuracy in a particular transfer function calculation, as described in the above-identified reference by Zhijiang He, Mustafa Celik and Lawrence Pileggi. Because $r_0$ is a global parameter, as $r_0$ is adjusted, the entire inductance extraction must be redone. Moreover, the shell technique does not work well for long wires broken into many segments. For a value of $r_0$ sufficiently small to render coupling in the transverse direction sparse, correctly modeling the loop inductances of such long wires may require including mutual inductances between collinear segments more than a distance $r_0$ away.

Accordingly, a need clearly exists for a method for inductance extraction for high frequency integrated circuits, which guarantees a positive semi-definite inductance matrix, while rendering the inductance matrix sparse.

SUMMARY OF THE INVENTION

The problems and drawbacks of the prior art, as discussed above, are substantially overcome, and the above-mentioned need is substantially satisfied by the present invention, which is a method for extracting inductances of the interconnection of an integrated circuit which provides a positive semi-definite inductance matrix. The method comprises the steps of first determining the power distribution lines and the ground distribution lines of the integrated circuit. The method further comprises fracturing the signal lines into horizontal and vertical segments, and deriving from the power distribution lines and the ground distribution lines a plurality of disjointed interaction regions, each having a respective section of one or more signal lines, respective sections of two or more of the power distribution lines or the ground distribution lines. The respective sections of the power distribution lines and ground distribution lines in each interaction region are also fractured into vertical and horizontal segments. In each interaction region there is then determined a plurality of coupled loop inductances each defined by a current loop passing through a respective one of the signal line segments in the interaction region and returning through a respective one of the power distribution line segments or a respective one of the ground distribution line segments in the interaction region, the respective one of the power distribution line segments or the respective one of the ground distribution line segments being parallel and adjacent to the respective one of the signal line segments. In addition, the method includes eliminating in each interaction region current loops that do not pass a net current through a signal line segment, and combining in each interaction region the coupled loop inductances into a reduced set of equivalent inductances that model the inductance of each signal line section in the interaction region.

Thus the inductance matrix of the circuit chip is rendered sparse in two important ways: (1) the inductances of the power distribution lines and the ground distribution lines are extracted independently of the signal lines, and therefore, there is no mutual coupling between power and ground distribution lines, and signal lines; and (2) mutual inductances between signal lines are further restricted by set of simple geometry-based decomposition rules, which are referred to as halo rules, for defining the plurality of disjointed interaction regions.

BRIEF DESCRIPTION OF THE DRAWINGS

For a more complete understanding of the nature and benefits of the present invention, reference should be made to the following detailed description of exemplary embodiments taken in conjunction with the accompanying drawings, in which

FIG. 7A shows an isometric view of a core filament of thickness t and width $\Delta$;

FIG. 7B shows isometric views of two wires, one of width $3\Delta$ and the other of width $2\Delta$;

FIG. 8 depicts two parallel filaments, one having a length l and the other having a length m, the two filaments being separated in the longitudinal direction by a geometric mean distance $\delta$ with a geometric mean distance between them of $r_{ij}$;

FIG. 12B is a plan view of power distribution lines and ground distribution lines laid out in a grid in which vertical lines are spaced 100 $\mu$m apart and horizontal lines are spaced 21.6 $\mu$m apart, the power supply voltage $V_{DD}$ being carried on horizontal lines in metal level M3 at y=900 $\mu$m, 700 $\mu$m, 500 $\mu$m, 300 $\mu$m and 100 $\mu$m, ground being carried on the remaining horizontal lines in metal level M3 at y=800 $\mu$m, 600 $\mu$m, 400 $\mu$, 200 $\mu$m and 0 $\mu$m, the power supply voltage $V_{DD}$ being carried on vertical lines in metal levels M2 and M4 at x=21.6 μm, 64.8 μm and 108 μm, and ground being carried on the remaining alternate vertical lines in metal levels M2 and M4 as y=43.2 μm and 86.4 μm;

FIG. 12C is a plan view of the power and ground distribution grid of FIG. 12B in which no decoupling between power and ground is represented by shorting the power and ground distribution lines at the places marked by black rectangles, minimal decoupling between power and ground is represented by shorting of power and ground distribution lines at intersections marked by an "X", and complete decoupling of power and ground is represented by shorting of the power and ground distribution lines at the intersections marked by circles;

DETAILED DESCRIPTION

In the following detailed description of exemplary embodiments of the invention, it is assumed that the interconnects on the chip are Manhattan, i.e., all edges of all interconnects on the chip are either in a horizontal direction or a vertical direction and that these two directions are orthogonal. For a rectangular chip the horizontal direction is ordinarily the direction of a lateral edge of the chip while the vertical direction is ordinarily the direction of a longitudinal edge of the chip. While this is not a necessary condition, it simplifies the implementation of the invention and is satisfied by nearly all VLSI interconnect layouts. Geometries that are not Manhattan can be approximated by "staircase" constructions made up of multiple short segments in the horizontal and vertical directions. Accordingly, an orthogonal coordinate system may be introduced where the horizontal direction refers to the x direction and the vertical direction refers to the y direction. The z direction is perpendicular to surface of the chip.

Inductance extraction begins by fracturing each interconnect into vertical and/or horizontal segments. This static fracturing establishes rectangular segments and current directions. The static fracturing approach employed is very similar to that described in P. H. Xiao, E. Charbon, A. Sangiovanni-Vincentelli, T. vanDuzer and S. R. Whitely, "INDEX: An Inductance Extractor for Superconducting Circuits," IEEE Transactions on Applied Superconductivity, 3(1), pp. 2629–2632, March 1993.

Figure 1A:
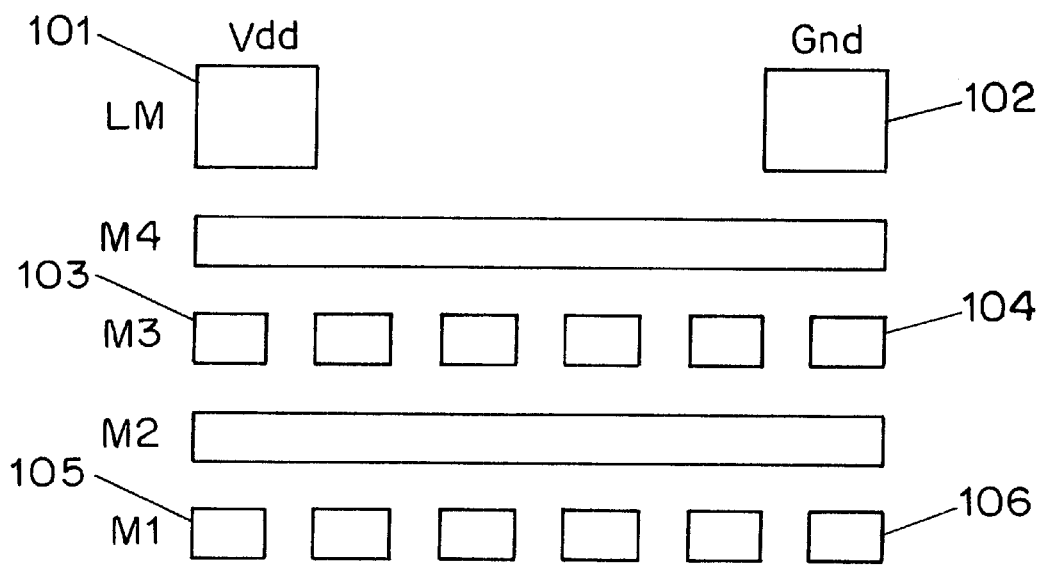
FIG. 1A shows an illustrative cross sectional view of an on-chip power and ground distribution grid formed on five conductor levels of an integrated circuit chip.
Figure 1B:
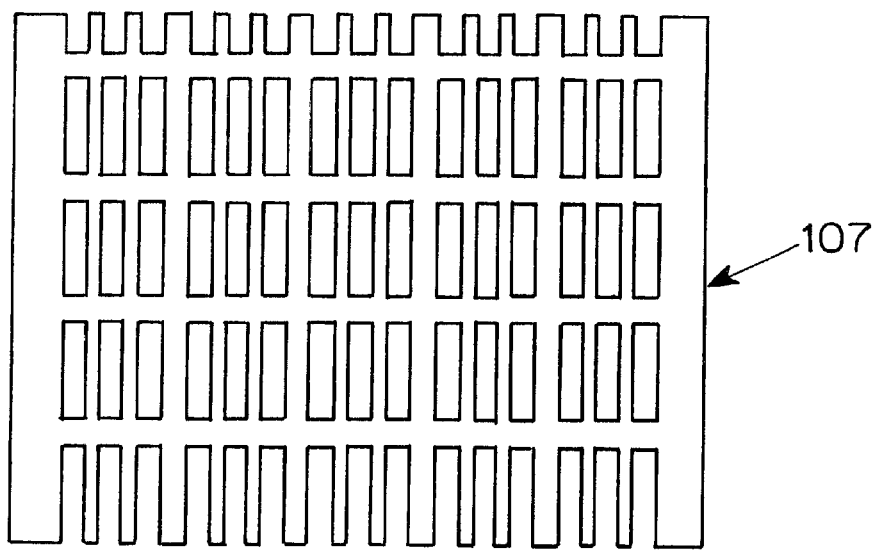
FIG. 1B shows an illustrative plan view of the on-chip power and ground distribution grid of FIG. 1A formed on five conductor levels of the integrated circuit chip.
Figure 1C:
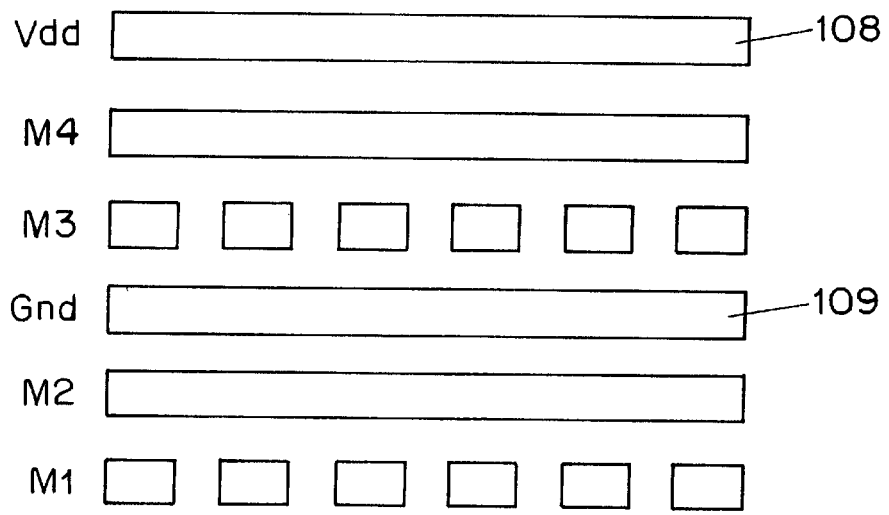
FIG. 1C shows an illustrative cross sectional view of an on-chip power and ground distribution design having a discrete power distribution plane and a discrete ground distribution plane formed on two dedicated conductor levels.
Figure 2:
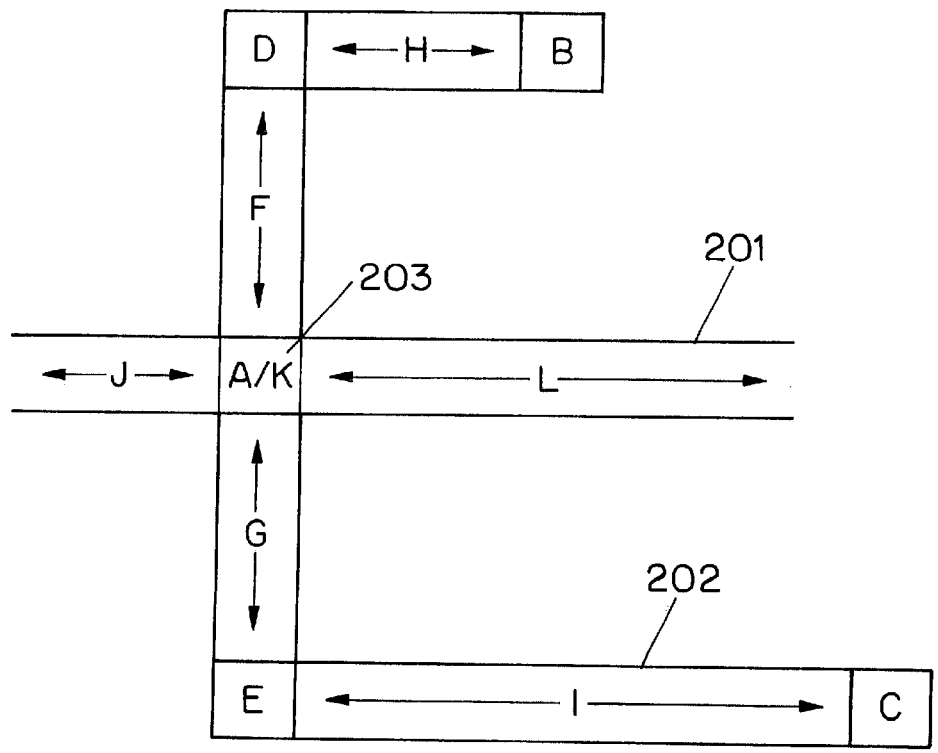
FIG. 2 illustrates static fracturing and direction setting of two interconnect lines on two different conductor levels, including a via for connecting the two interconnect lines and two external contacts on one of the interconnect lines.

If a given rectangular segment has two edges that are in contact with neighbors, it is determined whether the current flow through the segment is horizontal or vertical. Referring to FIG. 2, there is shown a plan view of two interconnects for illustrating static fracturing and direction setting. The shaded interconnect 201 is on a first metal level while the remaining interconnection 202 is on a second metal level. A via 203 connects rectangle A on the second metal level with rectangle K on the first metal level. Segments with unambiguous horizontal or vertical current flows are noted with arrows. Segments B and C are external contacts. If contacted edges are top and bottom, then the current flow is vertical, as in the case of segments F and G, while if the contacted edges are at the left and the right, the current flow is horizontal as in the case of segments H, I, J and L. In other cases, the current flow direction is mixed, as for segments that are contacted by only one neighbor, corner segments such as segments D and E, segments connected to vias such as segments A and K, and segments associated with external contacts such as segments B and C. It is noted that static fracturing seeks to minimize the interconnect area represented by mixed segments, since inductances are extracted only for horizontal and vertical segments.

Figure 3:
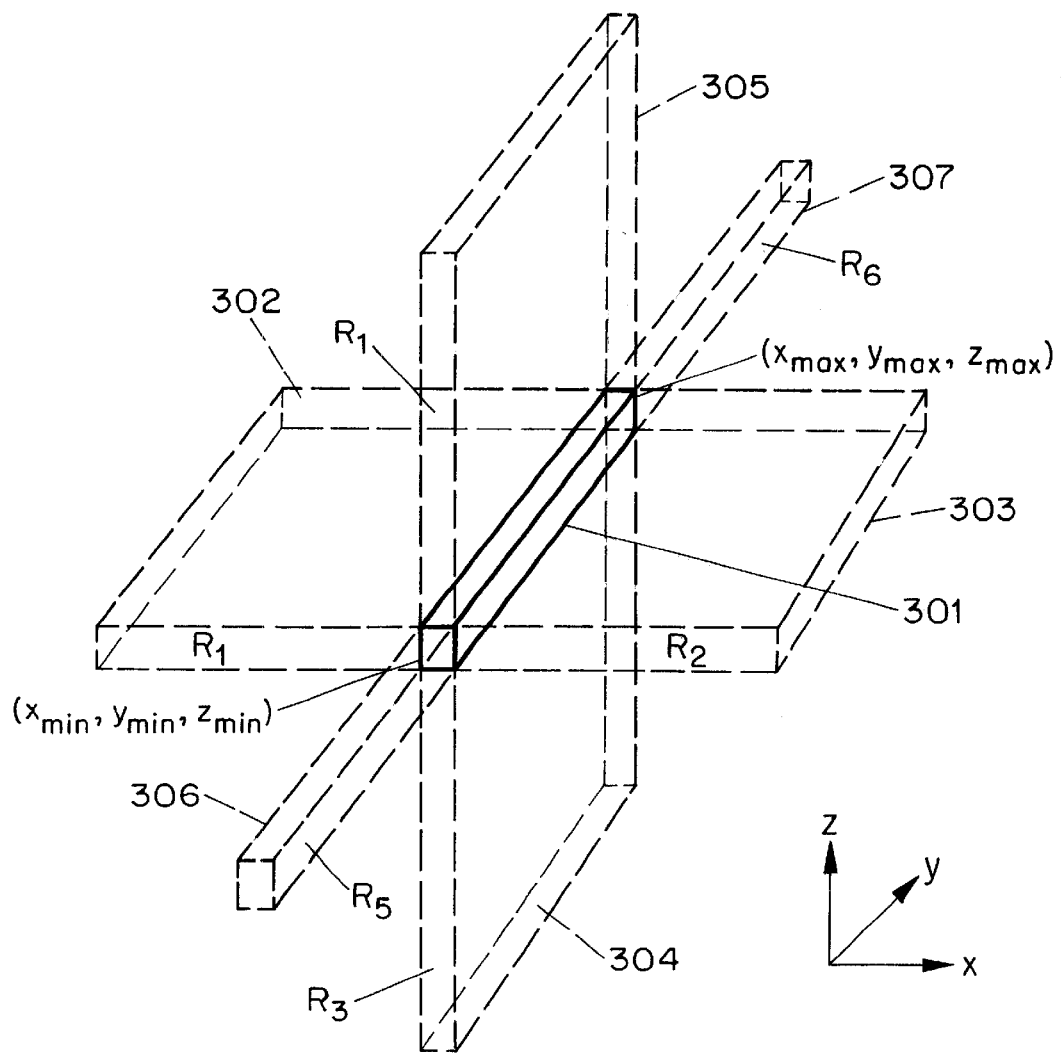
FIG. 3 shows an isometric view of an interconnect line segment illustrating the halo of the interconnect line segment.

Referring to FIG. 3, there is shown an interconnect segment 301, which is a rectangular paralellopiped defined by coordinates $(x_{min}, y_{min}, z_{min})$ and $(x_{max}, y_{max}, z_{max})$. The interconnect segment 301 may be a horizontal segment in which current flows through the segment is in the horizontal direction (i.e., in the x direction), or a vertical segment in which current flows through the segment in the vertical direction (i.e., in the y direction). In addition, a mixed segment is one in which the direction of current flow is not consistently horizontal or vertical. The interconnect segment 301 shown in FIG. 3 is a vertical segment extending in the y direction.

Also shown in FIG. 3 is the "halo" of the interconnect segment 301 which consists of six semi-infinite subregions 302, 303, 304, 305, 306 and 307, each extending from a respective one of the six surfaces of the interconnect segment 301. The halo of the segment 301 consists of a horizontal halo made up of regions 304, 305, 306 and 307 each extending in a direction orthogonal to the horizontal (i.e., x) direction, and a vertical halo having regions 302, 303, 304 and 305 each extending in a direction orthogonal to the vertical (i.e., y) direction.

After the static fracturing the chip is divided into a set of disjointed horizontal interaction regions and an independent set of disjointed vertical interaction regions. This is accomplished with a set of "halo rules" which are applied to signal line inductance extraction in accordance with the present invention as follows:

1) Horizontal and vertical signal line segments are treated independently since they do not inductively couple to each other. Segments with currents flowing in the horizontal direction can only couple inductively with other segments with currents flowing in the horizontal direction. Similarly, vertical segments can only couple inductively with other vertical segments. Accordingly, inductance extraction in accordance with the present invention can proceed in two separate "passes," one in which the inductances of horizontal segments are extracted and the other in which inductances of vertical segments are extracted.

Figure 4A:
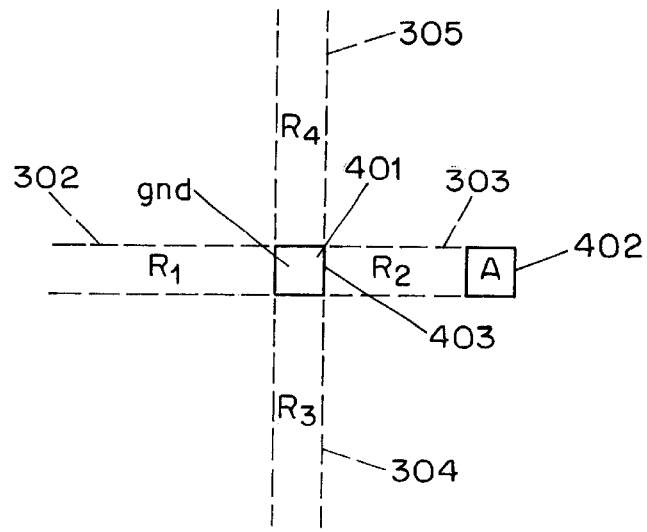
FIG. 4A shows an illustrative cross sectional view of a ground line segment and its vertical halo, and a signal line segment blocking a portion of the vertical halo of the ground line segment.

2) Horizontal halos of power and ground lines may be "blocked" by horizontal signal line segments, while vertical halos of power and ground lines may be "blocked" by vertical signal line segments. If the halos are viewed as collimated beams of constant cross section emanating orthogonally from each face of a line segment, then blocking occurs whenever any of these beams are interrupted by another segment parallel to the face from which the beam being interrupted emanates. Turning to FIG. 4A, there is shown a cross sectional view of a ground line segment 401 extending in the vertical direction and its vertical halo regions 302, 303, 304 and 305. Also shown is the cross section of a signal line segment 402 which extends in the vertical direction and which is parallel to the face 403 of the ground line segment 401 from which vertical halo region 303 emanates. Therefore, signal line segment 402 blocks vertical halo region 303 of ground line segment 401.

Figure 4B:
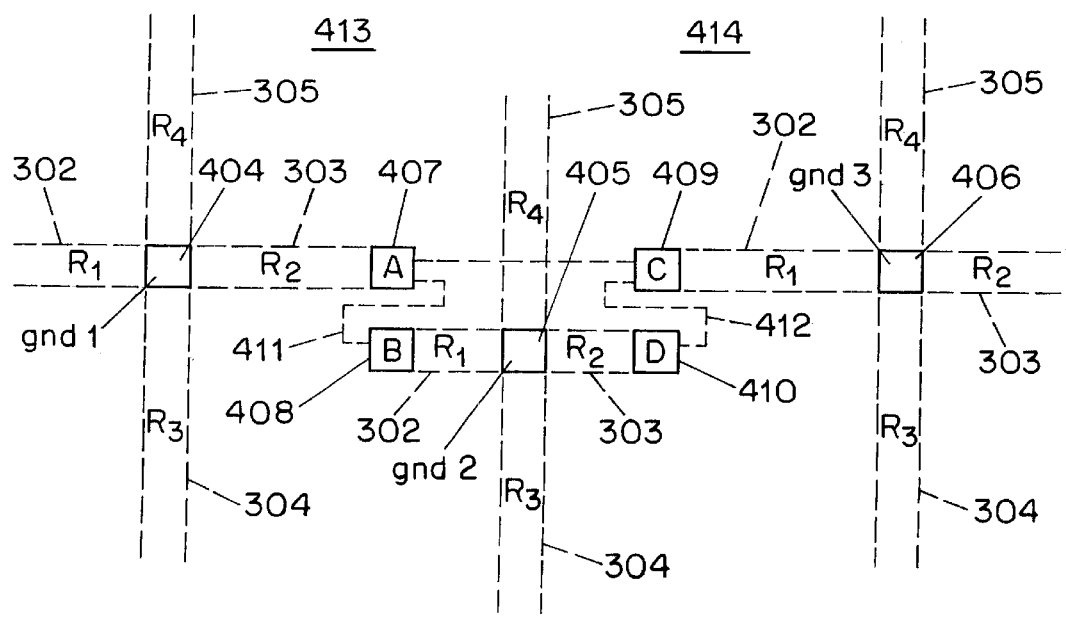
FIG. 4B shows an illustrative cross sectional view of three ground line segments and their respective vertical halos defining two vertical interaction regions, each of which has two signal line segments.

3) Inductive coupling between two horizontal segments is non-zero if and only if it is possible to connect the two segments by a path which does not cross the horizontal halo of any power distribution line or ground distribution line. Similarly, inductive coupling between two vertical segments is non-zero if and only if it is possible to connect the two segments by a path which does not cross the vertical halo of any power distribution line or ground distribution line. It is noted that when carrying out vertical signal line inductance extraction one need only consider vertical halos of ground distribution lines and power distribution lines, and these halos can only be blocked by vertical signal line segments. Horizontal (or mixed) signal line segments do not have to be considered at all. Similarly, when carrying our horizontal signal line inductance extraction, one need only consider horizontal halos of ground distribution lines and power distribution lines, and these halos can only be blocked by horizontal signal line segments. Vertical (or mixed) signal line segments do not have to be considered at all. Referring to FIG. 4B, there is shown cross sections of three vertical ground line segments 404, 405 and 406 and their respective vertical halo regions 302, 303, 304 and 305. Also shown are cross sections of four vertically extending signal line segments 407, 408, 409 and 410. Signal line segments 407 and 408 inductively couple, for example, because it is possible to connect them by a path 411 which does not cross the vertical halo of any power distribution or ground distribution line. Similarly, signal line segments 409 and 410 inductively couple because it is possible to connect the two segments by a path 412 which does not cross the vertical halo of any power distribution or ground distribution line. However, signal line segments 407 and 409 do not inductively couple because all paths between these two segments must cross either halo region 304 or 305 of ground line segment 405.

These halo rules divide the chip interconnect into a plurality of disjoint horizontal interaction regions defined by the non-blocked horizontal halos of power distribution lines and ground distribution lines. Horizontal segments must be contained within the same horizontal interaction region to inductively couple to one another. Independently, the chip is also divided into a plurality of disjoint vertical interaction regions defined by the non-blocked vertical halos of power distribution lines and ground distribution lines. Similarly, vertical segments must be contained within the same vertical interaction region to inductively couple to one another. Referring again to FIG. 4B, the halo rules result in the definition of two disjoint vertical interaction regions 413 and 414. Interaction regions are "disjointed" if signal line segments in one interaction region cannot interact with signal line segments in any other interaction region. In FIG. 4B interaction region 413 contains signal line segments 407 and 408, while interaction region 414 contain signal line segments 409 and 410.

For a given signal line segment, using halos of power distribution line segments and ground distribution line segments that are in the same direction as the signal line segment to define an interaction region reflects the assumption that current returns are approximately zero beyond the nearest power and ground distribution lines that are in the same direction at frequencies where the inductive reactance would dominate the impedance of the signal line segment.

Since power and ground distribution lines are always available as current returns, this assures that every signal line has an associated fail-safe current return. The blocking of a halo region of a power or ground distribution line by an overlapping signal line segment in the same direction as the power or ground distribution line takes into account coupling to the blocking signal line segment which enables segments of either side of the overlapped power or ground distribution line to interact with one another.

Figure 5:
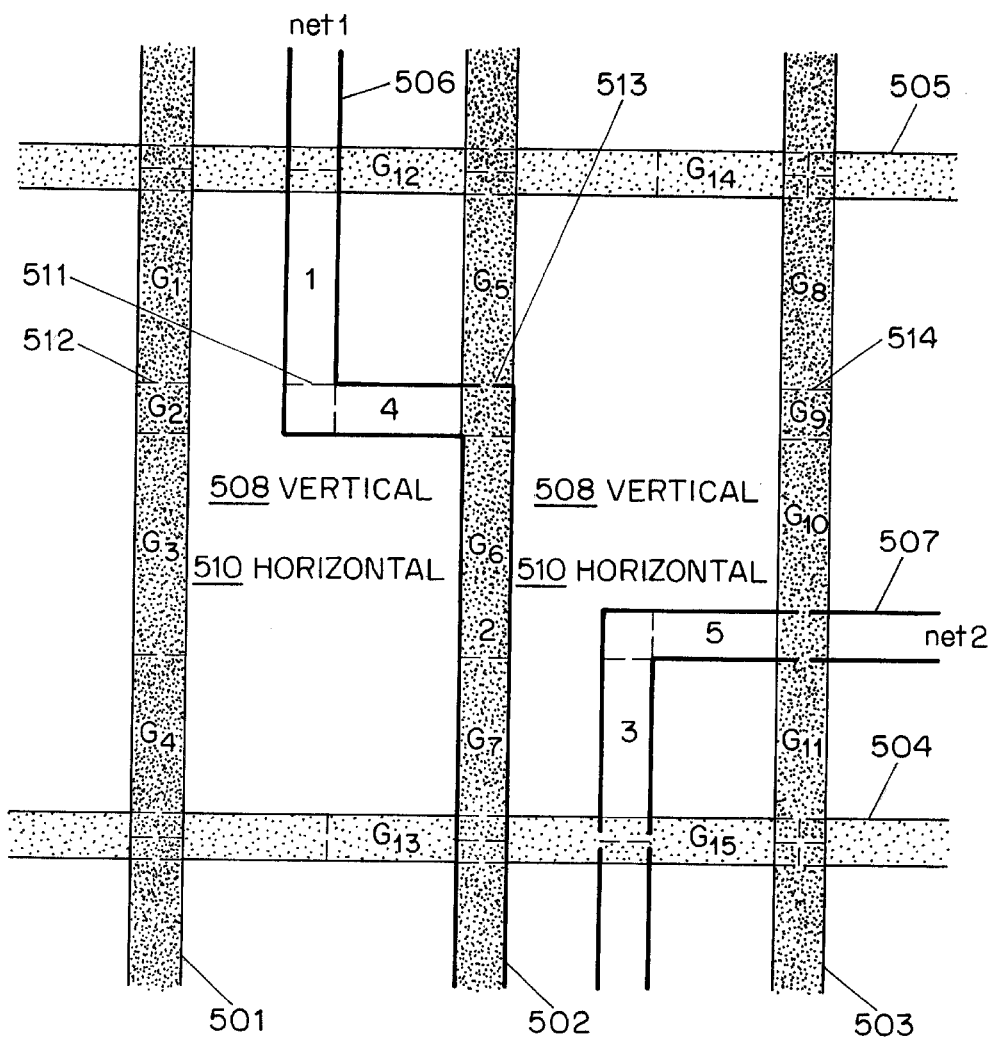
FIG. 5 is a diagram illustrating the application of the halo rules in three dimensions, where three vertical power distribution lines on one conductor level, two horizontal ground distribution lines on another conductor level and two signal lines on a third conductor level defining one vertical interaction region and two horizontal interaction regions, and the result of static and dynamic fracturing of the power and ground distribution lines, and the signal lines.

Turning to FIG. 5, there is shown an example of the application of the halo rules to a more complex three-dimensional interconnect topology on a five level metallization process, the metallization levels being denoted from top to bottom as M5, M4, M3, M2 and M1. The plan view of FIG. 5 shows the interconnect topology on metallization levels M3, M4 and M5. The interconnect lines 501, 502, 503, 504 and 505 are on metallization levels M4 and M5, and are all associated with power or ground distribution. Two signal line sections 506 and 507 are routed on metallization level M3. The respective halos of vertical power or ground distribution lines 501 and 503 and horizontal power or distribution lines 504 and 505 define a vertical interaction region 508 shown in cross hatch for a signal line segments 1 through 3, and also define two horizontal interaction regions 509 and 510 for signal line segments 4 and 5, respectively. The vertical halo of power or ground distribution line 502 does not divide the vertical interaction region 508 because that vertical halo is blocked by a vertical segment of signal line section 506 which overlaps the power or ground distribution line 502. However, the blocking of the vertical halo of power or ground distribution line 502 does not prevent the horizontal halo of this same segment from defining a boundary of horizontal interaction regions 509 and 510. Accordingly, vertical segment 1 of signal line section 506 interacts with vertical segment 3 of signal line section 507, while horizontal segment 4 of signal line section 506 does not interact with horizontal segment 5 of signal line section 507 because the two horizontal segments are in different horizontal interaction regions. In general, defining interaction region boundaries with the halos of orthogonally directed power or ground distribution lines depends primarily on whether such localization preserves enough inductive coupling between colinear segments to accurately predict the inductance of long interconnects.

After the interaction regions are defined, dynamic fracturing is used to create additional fractures in the signal, ground and power lines required for the inductance calculation. Dynamic fractures must be generated whenever the interaction environment as defined by the power distribution lines or the ground distribution lines of the interaction regions changes. That is, static fractures in the power distribution line sections and the ground distribution line sections must be projected onto the signal line sections. A section is that portion of a signal line, a power distribution line or a ground distribution line that is in a given interaction region. Additional signal line fractures may sometimes be necessary for long uniform wire runs to insure a reasonable approximation of the distributed nature of the resistance and inductance of the wire. Also signal line segments cannot span more than one interaction region. Therefore, new fractures must be created to split segments between interaction regions. Once all of the static and dynamic signal line fractures have been defined, these fractures must be in turn projected onto the parallel adjacent power and ground distribution lines. For example, in FIG. 5 the fracture 511 of signal line 506 is projected onto parallel adjacent power or ground distribution line segments 501, 502 and 503 as fractures at 512, 513 and 514, respectively.

Turning back to FIG. 5, all of the fractures necessary for signal line inductance extraction are shown in the figure. The model for each signal line segment which results from the dynamic fracturing is a resistance (i.e., the dc value for the signal line segment as will be discussed in further detail hereinbelow) in series with a parallel combination of loop inductances, where each loop inductance is defined by a respective signal line segment returning through a respective one of the return segments defined in the parallel adjacent power or ground distribution line sections in the interaction region. These inductance values are referred to herein as "return-limited loop inductances." In the example of FIG. 5, signal line segment 1 has three return-limited loop inductances associated with it as defined by current returns through parallel adjacent power or ground distribution line segments $G_1$, $G_5$ and $G_8$. Signal line segment 2 has current returns through parallel adjacent power or ground distribution supply line segments $G_3$, $G_6$ and $G_{10}$, while signal line segment 3 has current returns through parallel adjacent power or ground distribution line segments $G_4$, $G_7$ and $G_{11}$. Signal line segment 4 has current returns through parallel adjacent power or ground distribution line segments $G_{12}$ and $G_{13}$, while signal line segment 5 has current returns through parallel adjacent power or ground distribution line segments $G_{14}$ and $G_{15}$.

Figure 6A:
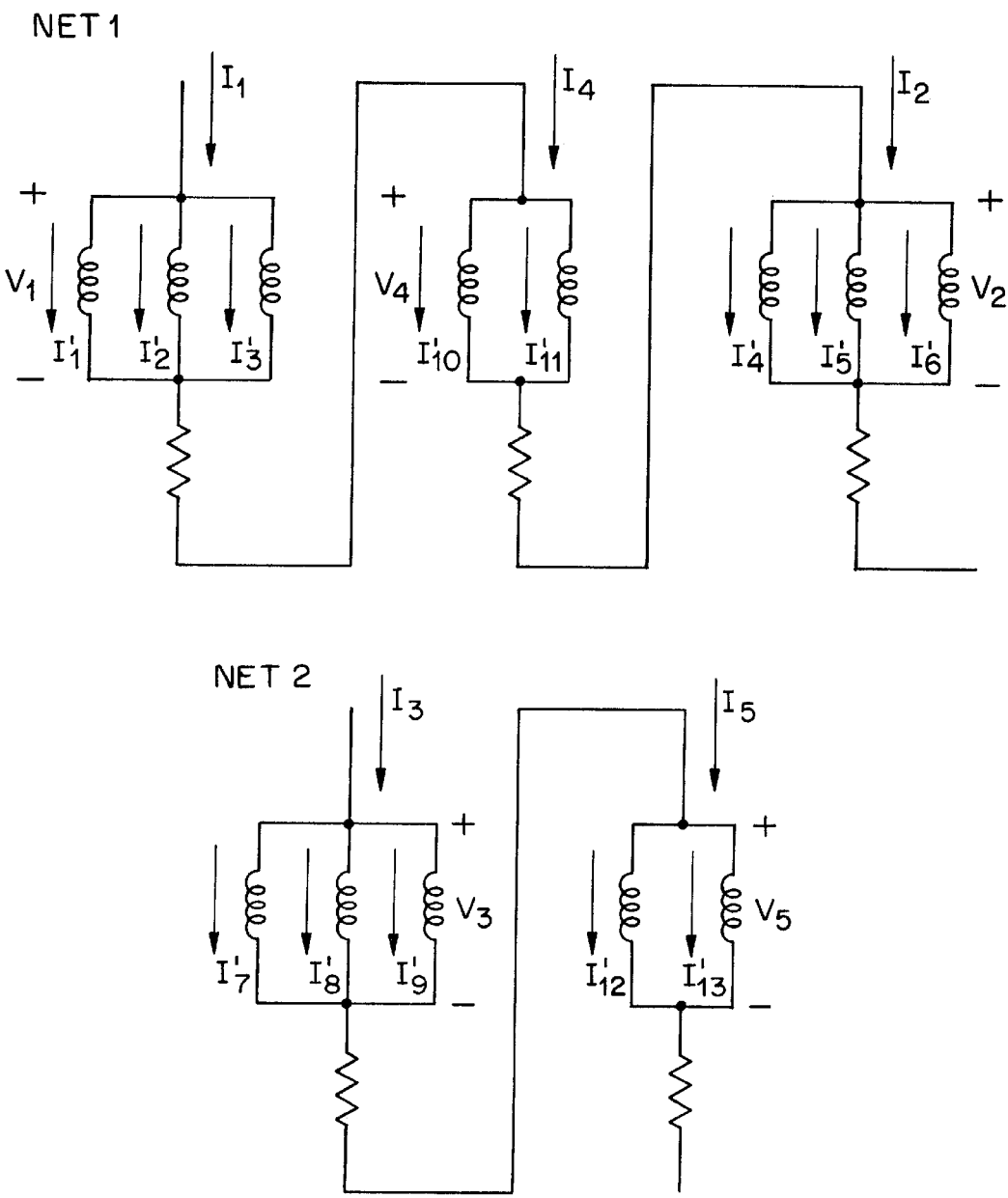
FIG. 6A is a schematic diagram of resistance and inductance extractions for the two signal line sections of FIG. 5 in a full return-limited loop inductance representation, where each inductance is coupled to all of the other inductances in the interaction region.

Turning to FIG. 6A, there is shown the corresponding circuit representations for signal line sections 506 and 507 of FIG. 5, which are denoted as net1 and net2, respectively. With reference to FIGS. 5 and 6A, the currents flowing through the individual inductances in FIG. 6A are the loop currents defining the return-limited loop inductances. For example, current $I'_1$ is the current flowing through signal line segment 1 and returning through adjacent parallel power or ground distribution line segment $G_1$, $I'_2$ is the current flowing through signal line segment 1 and returning through adjacent, parallel power or ground distribution line segment $G_5$, while $I'_3$ is the current flowing through signal line segment 1 and returning through adjacent, parallel power or ground distribution line segment $G_8$.

The partial inductance matrix is denoted by $\mathcal{L}$. In terms of the partial inductances, the return-limited loop inductances for the vertical segments 1, 2 and 3 of FIG. 5A are given by $$L' = \begin{pmatrix} L'_{11} & L'_{12} & L'_{13} \\ L'_{21} & L'_{22} & L'_{23} \\ L'_{31} & L'_{32} & L'_{33} \end{pmatrix} \quad (2)$$

for the vertical interaction region 508 in FIG. 5, and the return-limited loop inductances of the horizontal segments 4 and 5 of FIG. 5 are given by $$L' = L'_{44} \quad (3a)$$

for horizontal interaction region 509 in FIG. 5, and $$L' = L'_{55} \quad (3b)$$

for horizontal interaction region 510 in FIG. 5, where $L'_{ij}$ is the matrix of return-limited loop inductances associated with signal line segments i and j for i≠j, or associated with signal line segment i for i=j. For example, $$L'_{11} = \begin{pmatrix} \mathcal{L}_{11} + \mathcal{L}_{\tilde{1}\tilde{1}} - \mathcal{L}_{1\tilde{1}} - \mathcal{L}_{1\tilde{1}} & \mathcal{L}_{11} + \mathcal{L}_{\tilde{1}\tilde{5}} - \mathcal{L}_{1\tilde{5}} - \mathcal{L}_{\tilde{1}1} & \mathcal{L}_{11} + \mathcal{L}_{\tilde{1}\tilde{8}} - \mathcal{L}_{18} - \mathcal{L}_{\tilde{1}1} \\ \mathcal{L}_{11} + \mathcal{L}_{\tilde{5}\tilde{1}} - \mathcal{L}_{1\tilde{1}} - \mathcal{L}_{\tilde{5}1} & \mathcal{L}_{11} + \mathcal{L}_{\tilde{5}\tilde{5}} - \mathcal{L}_{15} - \mathcal{L}_{\tilde{5}1} & \mathcal{L}_{11} + \mathcal{L}_{\tilde{5}\tilde{8}} - \mathcal{L}_{18} - \mathcal{L}_{\tilde{5}1} \\ \mathcal{L}_{11} + \mathcal{L}_{\tilde{8}\tilde{1}} - \mathcal{L}_{1\tilde{1}} - \mathcal{L}_{\tilde{8}1} & \mathcal{L}_{11} + \mathcal{L}_{\tilde{8}\tilde{5}} - \mathcal{L}_{15} - \mathcal{L}_{\tilde{8}1} & \mathcal{L}_{11} + \mathcal{L}_{\tilde{8}\tilde{8}} - \mathcal{L}_{18} - \mathcal{L}_{\tilde{8}1} \end{pmatrix} \quad (4)$$

where the "tilde" indices refer to the power or ground distribution line segments. For example, $\mathcal{L}_{\tilde{1}\tilde{1}}11$ is the partial self-inductance of power or ground distribution line segment $G_1$.

Both the partial inductance matrix and the return-limited loop inductance matrix are symmetric and positive semi-definite. Since the interaction regions do not couple in any way, when the return-limited loop inductance matrices for the interaction regions, including all D segments in each region, are combined one at a time, the return-limited loop inductance matrix of the entire chip is block diagonal, with each block representing the horizontal or vertical signal line segments of a respective one of the interaction regions. The return-limited loop inductance matrix is still very dense because each return-limited loop inductance is coupled to each other return-limited loop inductance in the same interaction region.

Figure 6B:
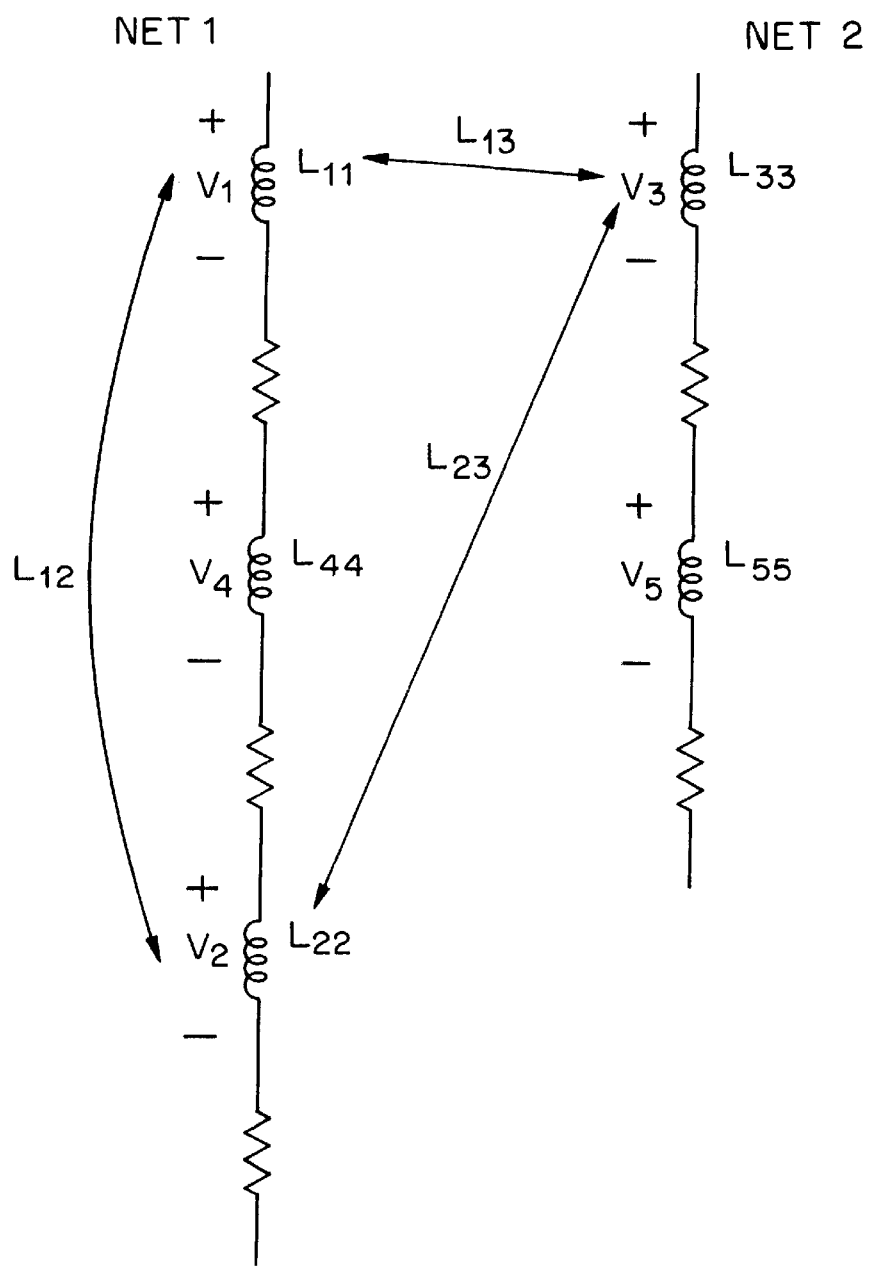
FIG. 6B is a schematic diagram representing the resistance and inductance extractions for the two signal line sections of FIG. 5 in an equivalent return-limited inductance representation.

It is noted that current circulating in the return-limited inductance loops of FIG. 6A correspond to current configurations in which the current is flowing through power and ground distribution line segments but not in the signal line segment. One way this can occur is if two current loops each pass a current of the same magnitude but in opposite directions through a signal line segment so as to result in a zero net current through the signal line segment. Accordingly, the circuit of FIG. 6A can be reduced to the circuit of FIG. 6B by assuming that such circulating currents are zero. The inductances in the circuit of FIG. 6B are called the "return limited inductances."

A return-limited inductance matrix L for an interaction region may be derived as follows: If n is the number of return-limited loop inductances in the interaction region and m is the number of return-limited inductances in the interaction region, which is equal to the number of signal line segments in the interaction region, the return-limited loop inductance matrix L' for the interaction region is an n×n matrix. Then an n×m matrix B may be formed, in which each row corresponds to a respective one of the return-limited loop inductances and each column corresponding to a respective one of the signal line segments. The elements of the i-th column of the matrix B are all zeroes except for ones in rows corresponding to the return-limited loop inductances associated with the i-th signal line segment. The following expression is then derived:

$$sI = B^T L'^{-1} B V, \quad (5)$$

where s is a Laplace transform variable, I is a column vector having as elements respective currents flowing into the return-limited loop inductances associated with each signal line segment in the interaction region, and V is a column vector having as elements respective voltages across the return-limited loop inductances associated with each signal line segment in the interaction region. For example, in the full return-limited loop inductance representation of FIG. 6A, the elements of I are the currents $I_1, I_2, I_3, I_4$ and $I_5$, and the elements of V are the voltages $V_1, V_2, V_3, V_4$ and $V_5$. The return-limited inductance matrix of the interaction region is then given by $$L = (B^T L'^{-1} B)^{-1}. \quad (6)$$

The main computational cost here is two LU factorizations, one of the L' matrix associated with each horizontal and vertical interaction region, and the second to find the final return-limited inductance matrix L for the given interaction region. If the number of segments in a typical interaction region is on the order of several thousand, direct LU decomposition is most efficient. It may be advantageous to use iterative techniques for larger interaction regions. The m×m return-limited inductance matrix L, like the partial inductance matrix $\mathcal{L}'$ and the return-limited loop inductance matrix L', is symmetric and positive-definite.

Simplified partial inductance formulae from the above-identified book by F. Grover are used to calculate the return-limited loop inductances. One begins by defining the geometric mean distance (GMD) between two segments i and j of cross sectional areas $a_i$ and $a_j$, respectively. The transverse coordinates of a point in $a_i$ are x and z, and the transverse coordinates of a point in $a_j$ are x' and z' for the case where the segments are each directed in the y direction. Then the GMD $r_{ij}$ between segments i and j is given by $$\log_e r_{ij} = \frac{1}{2a_i a_j} \int dx \int dz \int dx' \int dz' \log_e((x-x')^2 + (z-z')^2). \quad (7)$$

The GMD $r_{ij}$ between a segment i and itself must also be defined. With these definitions, the approximate formulae for the partial self-inductance of a segment of length 1 may be expressed as $$\mathcal{L}_{ii} \cong 2 \times 10^{-13} \left[ \log_e\left(2\frac{l}{r_{ii}}\right) - 1 \right] \quad (8)$$

For lengths in microns and inductances in Henries. For two segments i and j having lengths l and m, respectively, arranged in the manner shown in FIG. 8, the partial mutual inductance between the two segments may be expressed as $$\mathcal{L}_{ij} \cong 1 \times 10^{-13} \left[ \alpha \sinh^{-1}\frac{\alpha}{r_{ij}} - \beta \sinh^{-1}\frac{\beta}{r_{ij}} - \gamma \sinh^{-1}\frac{\gamma}{r_{ij}} + \delta \sinh^{-1}\frac{\delta}{r_{ij}} - \sqrt{\alpha^2 + r_{ij}^2} + \sqrt{\beta^2 + r_{ij}^2} + \sqrt{\gamma^2 + r_{ij}^2} - \sqrt{\delta^2 + r_{ij}^2} \right], \quad (9)$$

where $\alpha = 1+m+\delta$, $\beta = 1+\delta$, $\gamma = m+\delta$ and $\delta$ is the lateral spacing between the two segments i an j, as shown in FIG. 8. This general example has a number of special cases. For instance, in the case where the two segments i and j are colinear, the partial mutual inductance $\mathcal{L}_{ij}$ is expressed as $$\mathcal{L}_{ij} \cong 1 \times 10^{-13}[(l+m+\delta)\log_e(l+m+\delta) - (1+\delta)\log_e(1+\delta) - (m+\delta)\log_e(m+\delta) + \delta\log_e\delta]. \quad (10)$$

Furthermore, if the ends of the two segments i and j touch one another, then the partial mutual inductance between the two segments $\mathcal{L}_{ij}$ is expressed as $$\mathcal{L}_{ij} \cong 1 \times 10^{-13} \left[ l \log_e l + \frac{m}{l} + m \log_e l + \frac{m}{m} \right]. \tag{11}$$

To find the GMD for the various cross sectional geometries encountered in inductance extraction, a summation technique is employed. For each metal interconnect a core filament of width Δ is defined such that every metal interconnect width may be expressed as a multiple of Δ, as shown in FIG. 7. For example, the GMD of the whole segment 1 from 1' in FIG. 7B, $r_{11'}$ is given by equation $$\log_e r_{11'} = (\log_e r_{1'1'} + \log_e r_{1'2'} + \log_e r_{1'3'})/3. \tag{12}$$

Similarly, the GMD of the whole segment 1 from 2' in FIG. 7B, $r_{12'}$ is given by $$\log_e r_{12'} = (\log_e r_{2'hd\ 1'} + \log_e r_{2'2'} + \log_e r_{2'3'})/3. \tag{13}$$

Likewise, the GMD of the whole segment 1 from 3' in FIG. 7B, $r_{13'}$ is given by $$\log_e r_{13'} = \log_e r_{11}. \tag{14}$$

The GMD of the whole segment 1 to itself in FIG. 7B, $r_{11}$ is then $$\log_e r_{11} = (\log_e r_{1'1} + \log_e r_{2'1} + \log_e r_{3'1})/3. \tag{15}$$

Correspondingly, the GMD between segments 1 and 2 in FIG. 7B, $r_{12}$ is given by $$\log_e r_{12} = (\log_e r_{1'1''} + \log_e r_{1'2''} + \log_e r_{2'1''} + \log_e r_{2'2''} + \log_e r_{3'1''} + \log_e r_{3'2''})(1/6)$$

In this way, there only need to be developed lookup tables for the GMD of a core filament to itself and the GMD between two core filaments on any two metal levels as a function of distance between them.

Because the skin effect is ignored in calculating the partial inductances, the resistances and the return-limited inductances extracted are frequency dependent. The crossover frequency $f_c$ of a filament is defined as the frequency at which $R = 2\pi f_c L$, where R is the resistance of the segment and L is the return-limited self inductance of the segment. It is noted that self inductance is being used to capture the "worst case" inductance. This may not be accurate if the segment is "too short," and the mutual inductance to colinear segments is significant. For typical crossover frequencies, the skin depth almost always exceeds the interconnect thickness and width. That is, the frequency dependence of the resistance occurs at frequencies above $f_c$, where the inductive response dominates, and, therefore, can be safely ignored in nearly all cases. For example, for f=500 MHz the skin depth is 3.7 μm for aluminum and 2.9 μm for copper at 300° K. Additionally, $f_{max}$ is defined as the maximum frequency content of on-chip signals. Ordinarily the highest frequency content as determined by the fastest on-chip slew times to be 50–100 times the clock frequency, and $f_{max}$=10 GHz would be reasonable for a clock frequency of 500 MHZ. For segments where $f_c \gg f_{max}$, the inductance of the segment itself can be ignored entirely as can its inductive coupling to other segments, i.e., inductances need only be extracted where necessary. In rare cases in which the frequency dependence of the resistance might be significant for frequencies comparable to or below $f_c$, the return-limited inductance extraction approach may be refined to employ a ladder equivalent circuit, similar to what is described in B. Krauter and S. Mehrotra, "Layout Based Frequency Dependent Inductance and Resistance Extraction for On-Chip Interconnect Timing Analysis," 35th ACM/IEEE Design Automation Conference, pp. 303–308, 1998.

Figure 9A:
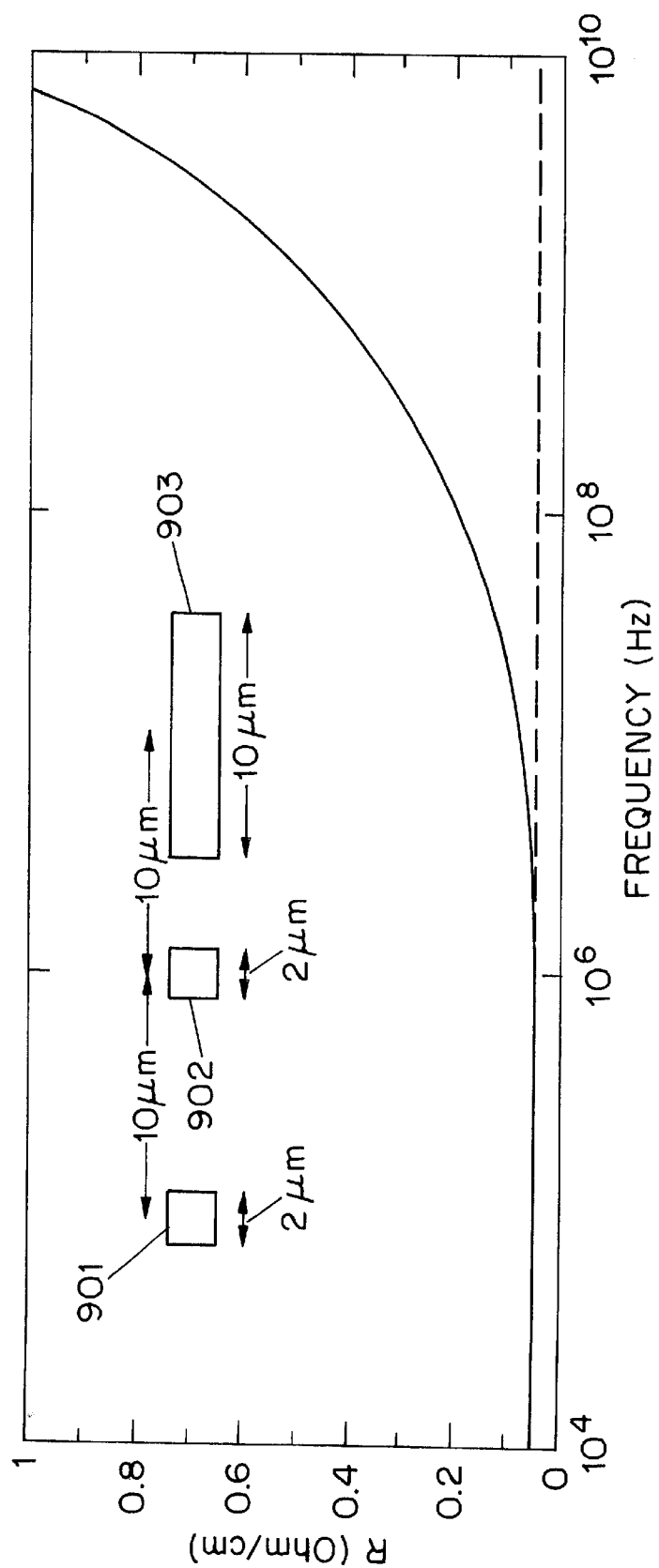
FIG. 9A is a graph of the resistance per unit length versus frequency of a single signal line which is coplanar with two ground returns in the arrangement illustrated in the inset of the graph, as computed using return-limited extraction of the present invention (dashed curve) and computed using the Fasthenry inductance extraction program (solid curve)
Figure 9B:
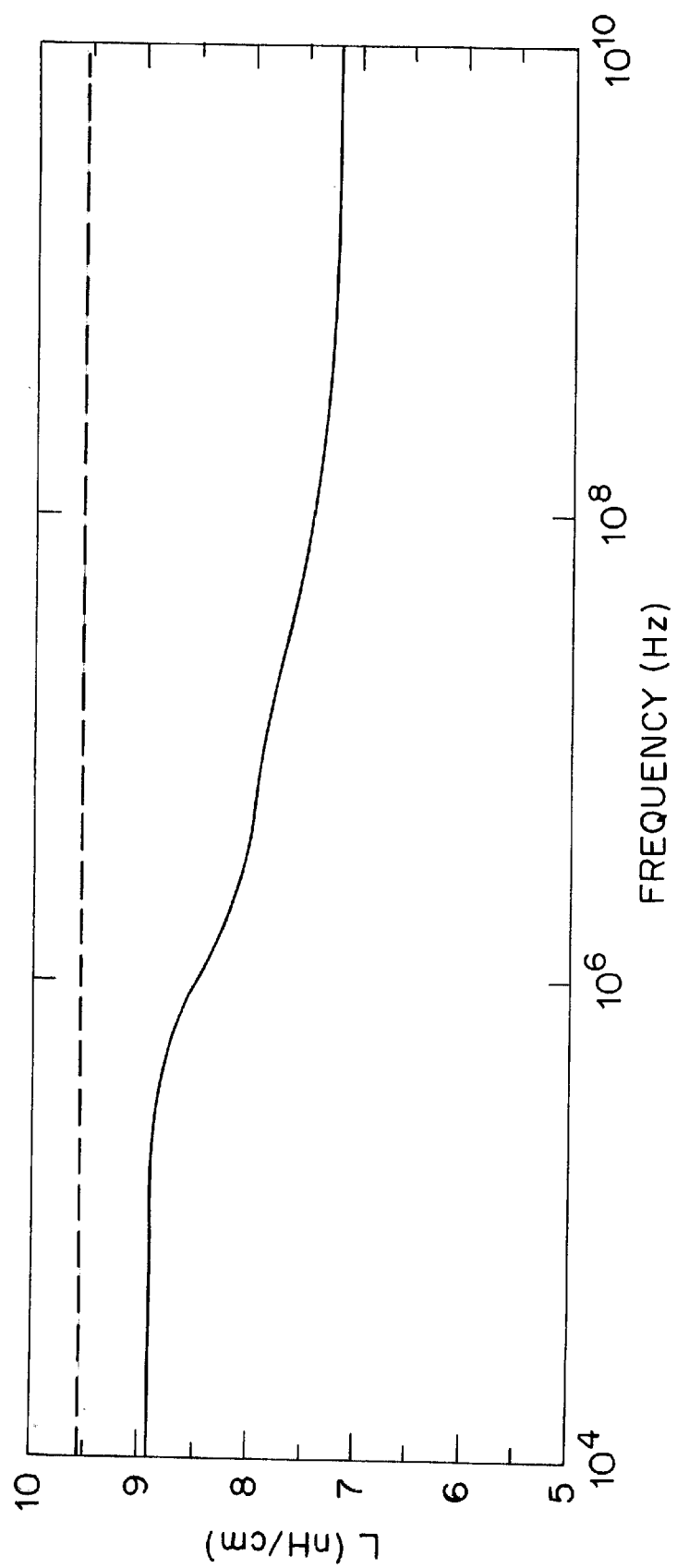
FIG. 9B is a graph of the inductance per unit length of a single signal line which is coplanar with two ground returns in the arrangement illustrated in the inset of FIG. 9A versus frequency, as computed using the return-limited inductance extraction of the present invention (dahsed curve) and computed using the Fasthenry inductance extraction program (solid curve)

As a result of the halo rules, the current returns characterizing the frequency-dependent inductance of a segment is restricted to lines which are in the same direction as the segment within the interaction region. To verify this approximation, a simple two-dimensional example is considered. Referring to the inset of FIG. 9A, a single signal line 901 is coplanar with two ground lines 902 and 903 where the far ends of lines 901, 902 and 903 are shorted. In FIGS. 9A and 9B, there are shown graphs of the resistance and inductance of the signal line 901, respectively, versus frequency, as calculated using the return-limited extraction of the present invention, the results of which are shown as the dashed curves, and as calculated using an inductance extraction program called Fasthenry, the results of which are shown as the solid curves. The Fasthenry program is described in M. Kamnon, M. J. Tsuk and J. White, "FastHenry, a Multipole-Accelerated 3-D Inductance Extraction Program," 30th ASCM/IEEE Design Automation Conference, pp. 678–683, Dallas, June 1993 and in M. Kamon, M. J. Tsuk and J. K. White, "FASTHENRY: A Multipole-Accelerated 3-D Inductance Extraction Program," IEEE Transactions on Microwave Theory and Techniques, 42(9), pp. 1750–1758, September 1994. The Fasthenry inductance extraction program, which is publically available from the website of the Massachusetts Institute of Technology, performs accurate detailed calculations of inductances for simple geometries, and is thus not suited for inductance extraction of large scale interconnect topologies to which the present invention is directed. The Fasthenry program is used here as a basis of comparison for the return-limited inductance extraction method of the present invention when applied to simple interconnection geometries.

Figure 9C:
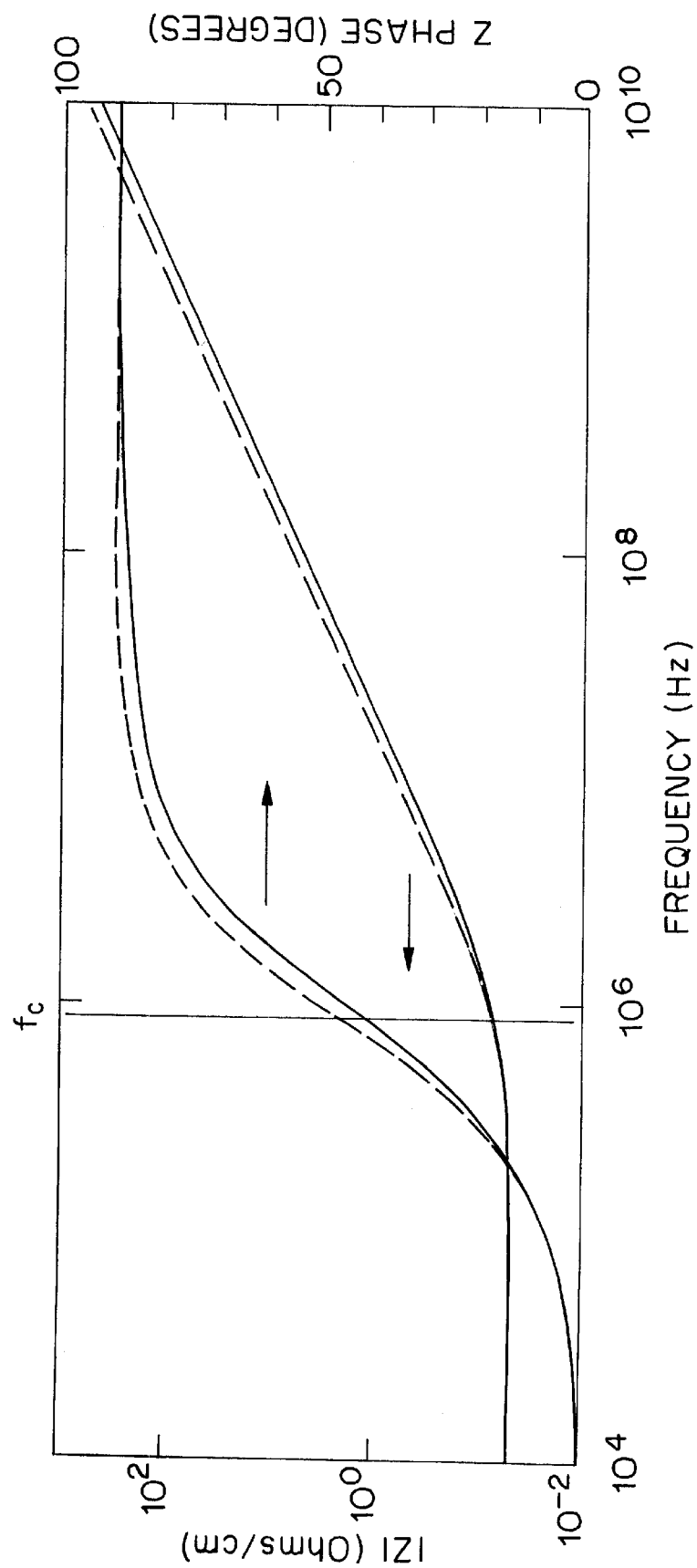
FIG. 9C is a graph of the magnitude and phase of the impedance of a single signal line which is coplanar with two ground returns in the arrangement illustrated in the inset of the graph of FIG. 9A versus frequency, as computed using the return-limited extraction of the present invention (dashed curves) and computing using the Fasthenry inductance extraction program (solid curves)

Because the return-limited inductance extraction ignores the parallel inductance of the more distant wide return and the associated skin effect, the inductance calculated with the return-limited inductance extraction as a result of this halo rule approximation is systematically overestimated, although not significantly. Because the frequency dependence of the resistance does not occur until frequencies well above fc, good agreement is obtained in the magnitude and phase of the impedance of the signal line segment 901 versus frequency, as calculated using the return-limited extraction of the present invention, the results of which are shown as the dashed curves, and as calculated using Fasthenry, the results of which are shown as the solid curves in the graph of FIG. 9C.

Figure 10A:
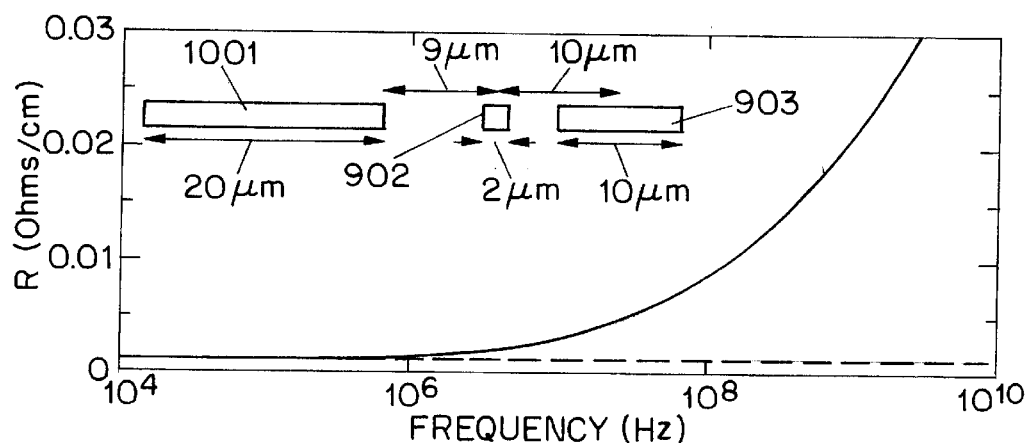
FIG. 10A is a graph of resistance per unit length of a single signal line which is coplanar with two ground returns in the arrangement shown in the inset of the graph, as calculated using the return-limited extraction of the present invention (dashed curve) and computed using the Fasthenry inductance extraction program (solid curve)
Figure 10B:
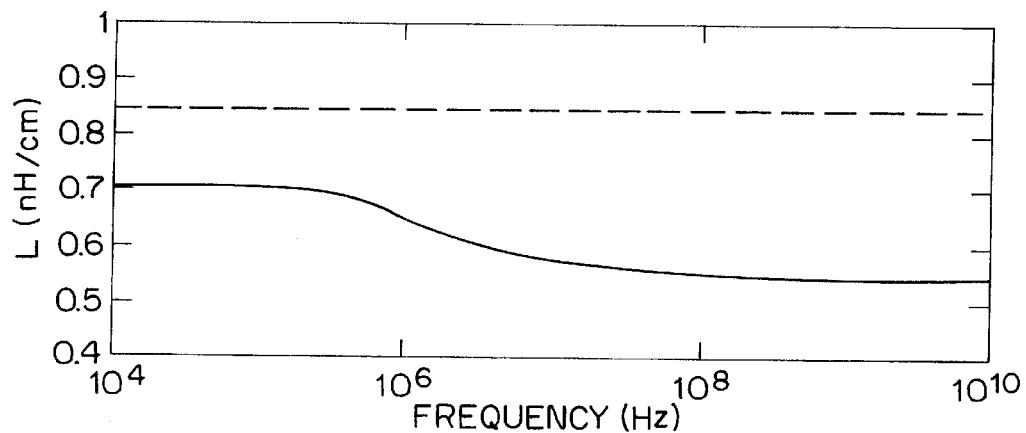
FIG. 10B is a graph of inductance per unit length of a single signal line which is coplanar with two ground returns in the arrangement shown in the inset of FIG. 10A versus frequency, as computed using the return-limited inductance extraction of the present invention (dashed curve) and using the Fasthenry inductance extraction program (solid curve)
Figure 10C:
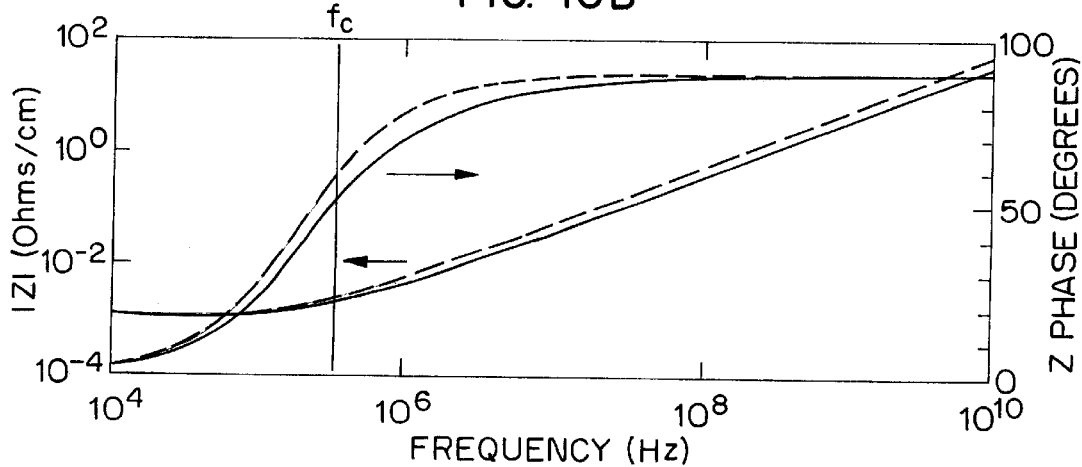
FIG. 10C is a graph of magnitude and phase of the impedance of a single signal line that is coplanar with two ground returns in the arrangement shown in the inset of FIG. 10A versus frequency, as computed using the return-limited inductance extraction of the present invention (dashed curves) and computed using the Fasthenry inductance extraction program (solid curves)

Turning to FIG. 10A, the inset shows a widened signal line 1001 for the same coplanar structure shown in the inset of FIG. 9A to determine the error associated with a wide signal line returning through a narrow ground line when a wider ground line further away is available. FIGS. 10A and 10B show graphs of the resistance and inductance of the signal line 1001, respectively, versus frequency, as calculated using the return-limited extraction of the present invention, the results of which are shown as the dashed curves, and as calculated using Fasthenry, the results of which are shown as the solid curves. As in the example of FIG. 9B, the return-limited inductance extraction slightly overestimates the self inductance of the signal line 1001 when compared with Fasthenry, as shown in FIG. 10B. As would be expected, the crossover frequency $f_c$ is lower for the widened signal line 1001, but the strong frequency dependence of the resistance still does not occur until frequencies above $f_c$, as shown in FIG. 10A. Consequently, FIG. 10C shows that good agreement is still obtained in both the magnitude and phase of the impedance of the signal line 1001, as calculated using the return-limited extraction of the present invention, the results of which are shown as the dashed curves, and as calculated using Fasthenry, the results of which are shown as the dashed curves. It is important to note that the proximity assumptions of the halo rules preserve the most problematic inductive couplings in digital integrated circuit design, for example, the case of wide, simultaneously-switching parallel busses without adequate interdigitated power and ground returns.

Figure 11A:
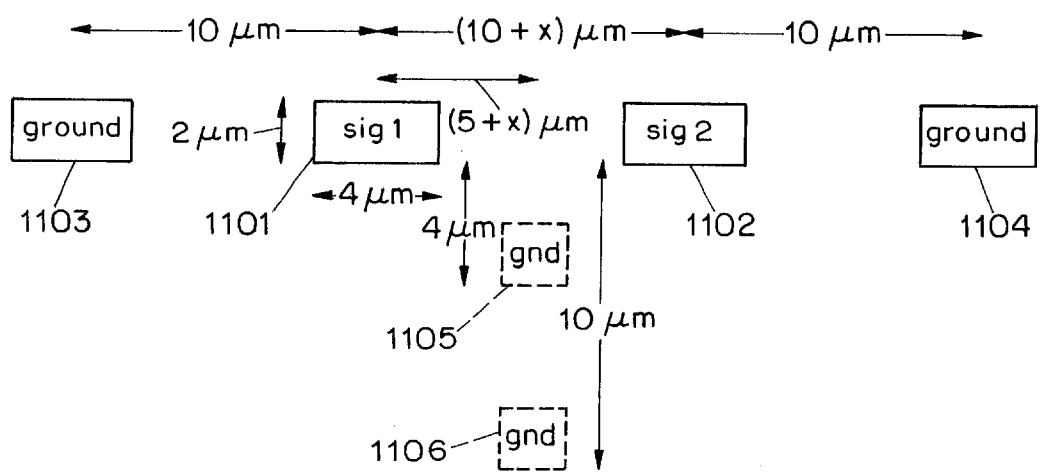
FIG. 11A shows a cross sectional view of an arrangement having two signal lines that are coplanar with two ground return lines and having two additional shaded ground lines below the plane of the two signal lines, each of the shaded ground lines projecting a halo that extends between the two signal lines.
Figure 11B:
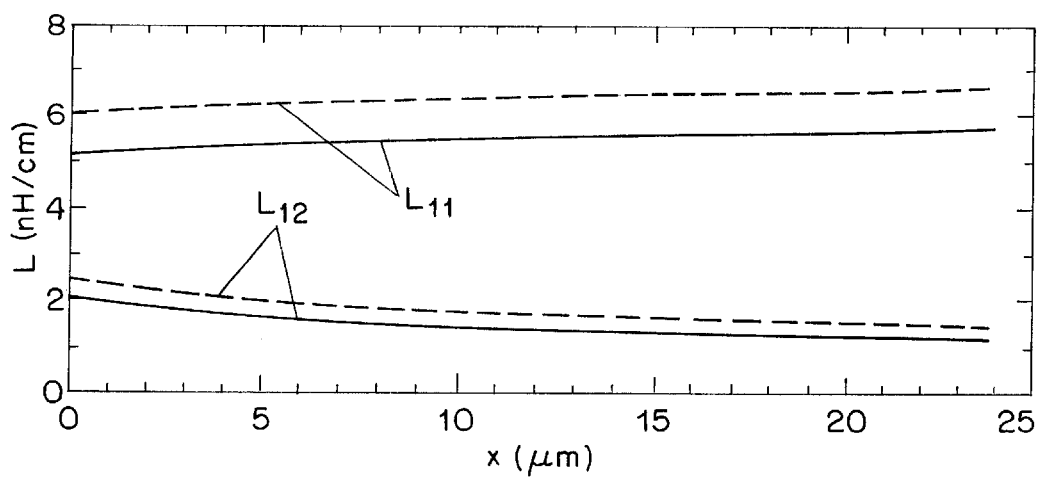
FIG. 11B is a graph of the self and mutual inductances of the signal lines of FIG. 11A at a frequency of 10 GHz versus the spacing between the signal lines in the absence of both shaded ground lines, as computed using the return-limited inductance extraction of the present invention (dashed curves) and computed using the Fasthenry inductance extraction program (solid curves), where $L_{11}$ denotes the self inductance of either one of the two signal lines and $L_{12}$ denotes the mutual inductance between the two signal lines.
Figure 11C:
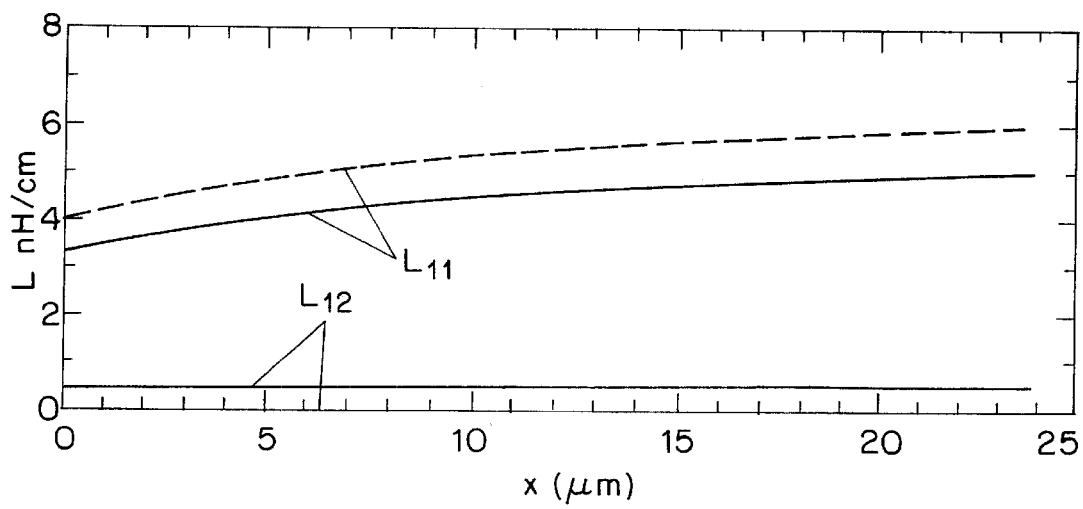
FIG. 11C is a graph of the self and mutual inductances of the two signal lines of FIG. 11A at a frequency of 10 GHz versus the spacing between the signal lines in the presence of the shaded ground line that is 4 $\mu$m below the plane of the two signal lines, as computed using the return-limited inductance extraction of the present invention (dashed curves) and computed using the Fasthenry inductance extraction program (solid curves), where $L_{11}$ denotes the self inductance of either one of the two signal lines and $L_{12}$ denotes the mutual inductance between the two signal lines.
Figure 11D:
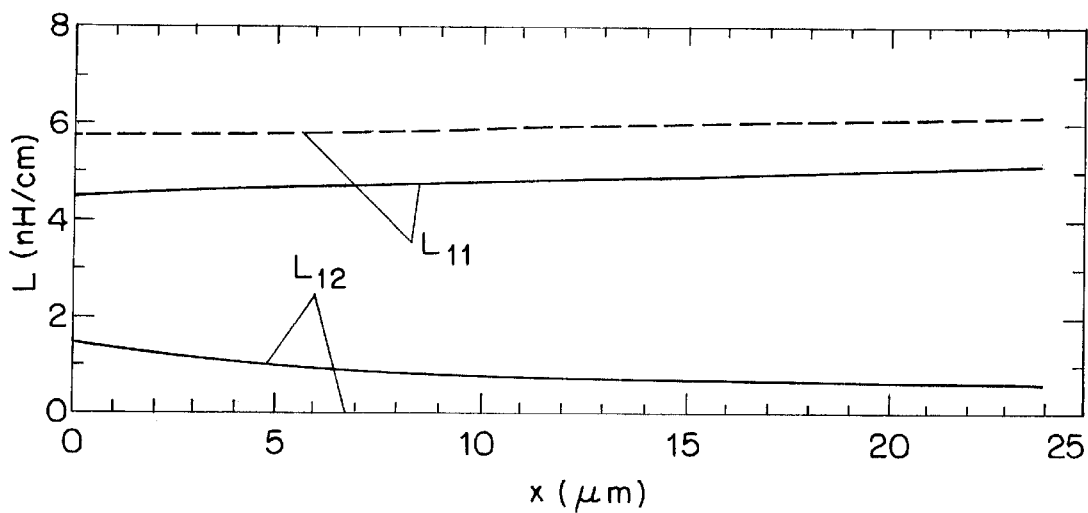
FIG. 11D is a graph of the self and mutual inductances of the two signal lines of FIG. 11A at a frequency of 10 GHz versus the spacing between the signal lines in the presence of the shaded ground line that is 10 $\mu$m below the plane of the two signal lines, as computed using the return-limited inductance extraction of the present invention (dashed curves) and computed using the Fasthenry inductance extraction program inductance extraction program (solid curves), where $L_{11}$ denotes the self inductance of either one of the two signal lines and $L_{,12}$ denotes the mutual inductance between the two signal lines.

Another important assumption embodied in the halo rules is the elimination of mutual inductances between segments which do not fall in the same vertical or horizontal interaction region. Referring to FIG. 11A, there are shown two signal line segments 1101 and 1102 which are coplanar with two ground return line segments 1103 and 1104. In addition there is a shaded ground line segment 1105 located 4 μm below the plane of the two signal lines 1101 and 1102, and another shaded ground line segment 1106 located 10 μm below the plane of the signal line segments 1101 and 1102. Turning to FIG. 11B, there is shown a graph of the self inductance $L_{11}$ and the mutual inductance $L_{12}$ of the two signal lines 1101 and 1102 of FIG. 11A as a function of the spacing between the two signal lines for a configuration where both of the shaded ground lines 1105 and 1106 are absent. The self and mutual inductances of the signal lines 1101 and 1102 where calculated using the return-limited inductance extraction of the present invention, the results of which are shown as the dashed curves, and calculated using Fasthenry, the results of which are shown as the solid curves. As explained in connection with the examples of FIG. 9B and FIG. 10B, the return-limited inductance extraction slightly overestimates the inductances. FIG. 11C is a graph of the self inductance $L_{11}$ and the mutual inductance $L_{12}$ of the signal lines 1101 and 1102 of FIG. 11A as a function of spacing between the signal lines with the presence of the shaded ground line segment 1105 located 4 μm below the plane of the signal line segments. In this case, the halo of ground line segment 1105 isolates the signal line segments 1101 and 1102 into different interaction regions so as to make the return-limited mutual inductance between them zero. Once again, the self inductance $L_{11}$ and mutual inductance $L_{12}$ of the signal lines 1101 and 1102 where calculated using the return-limited inductance extraction of the present invention, the results of which are shown as dashed curves, and calculated with Fasthenry, the results of which are shown as the solid curves. The results of the two methods of calculation are in reasonably good agreement. Turning to FIG. 11D, there is shown a graph of the self inductance $L_{11}$ and the mutual inductance $L_{12}$ of the two signal line segments 1101 and 1102 of FIG. 11A as a function of the spacing between the two signal lines with the presence of the shaded ground line segment 1106 located 10 μm below the plane of the two signal lines. Here again, the halo of ground line 1106 isolates signal lines 1101 and 1102 into different interaction regions so as to make the return-limited mutual inductance between them zero. The self and mutual inductances of the signal lines shown in FIG. 11D where again calculated using the return-limited inductance extraction of the present invention, the results of which are shown as the dashed curves, and calculated with Fasthenry, the results of which are shown as the solid curves. Here, the agreement between the inductance calculations using the two methods has become worse indicating that the halo rule approximation becomes less valid as the ground line providing the halo that prevents the mutual inductance between the two signal lines moves further away from the signal lines. In these extreme cases interaction regions may be merged into larger interaction regions to preserve some of the mutual couplings that would otherwise be eliminated.

In the return-limited inductance extraction approach for signal lines, package and substrate returns are not taken into account. While it is common to regard the substrate as a ground equipotential in extracting capacitances, the substrate is electrically "far away" due to its relatively high resistivity and, therefore, its relatively large skin depth. Accordingly, it is assumed that all ac current returns will find a path in a metal interconnect, which is assumed to be always electrically "closer." Moreover, the power grid is always accessible from the substrate through plugs. Whether current returns through the package can be ignored in on-chip inductance extraction, particularly in the context of last metal interconnect, will depend on the details of the technology. It is assumed that these returns are still electrically "far away."

Figure 12A:
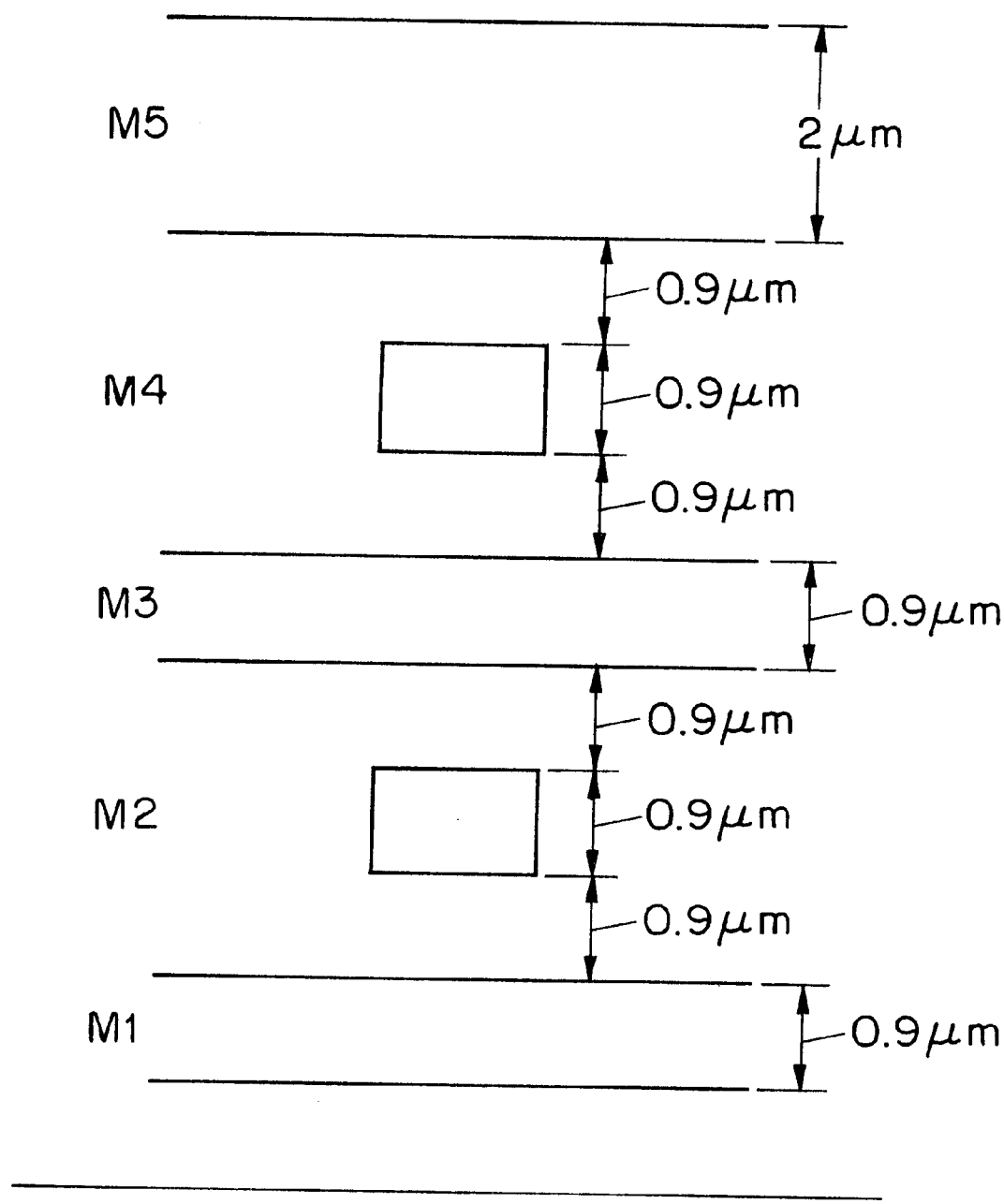
FIG. 12A is a layer map for a five level copper process in which level M5 is 2 $\mu$m thick while the other metal levels are each 0.9 $\mu$m thick.

To further demonstrate the efficiency and accuracy of return-limited inductance extraction, a prototype resistance and inductance extractor which can be used for complex three-dimensional interconnection geometries has been implemented. The extractor takes a shape text file input with established connectivity, similar to the format of the input file of the Fasthenry program. In the following comparisons between the prototype resistance and inductance extractor in accordance with the present invention and Fasthenry, a five level metal (copper) process shown in the layer map of FIG. 12A was assumed. Metal level M5 is 2 μm thick, while the other metal levels are 0.9 μm thick. With this metallization technology, the extraction tool was applied to the gridded power and ground interconnect network 1201 shown in FIG. 12B. In the power and ground distribution grid 1201 of FIG. 12B, power or ground lines on metal levels M5 and M3 run horizontally, while power or ground lines on metal levels M4 and M2 run vertically. Consistent with typical on-chip power and ground distribution grids used in VLSI circuits, power and ground distribution lines are spaced 100 μm apart vertically and 21.6 μm apart horizontally as shown in FIG. 12B. Power supply voltage $V_{DD}$ is carried on lines running horizontally on metal level M3 at y=900 μm, 700 μm, 500 μm, 300 μm and 100 μm. Ground is routed on the remaining horizontal lines of the grid on metal level M3 at y=800 μm, 600 μm, 400 μm, 200 μm and 0. Similarly, power supply voltage $V_{DD}$ is carried on vertical lines of the grid on metal levels M2 and M4 at x=21.6 μm, 64.8 μm and 108 μm. Ground is routed on the remaining alternate vertical lines of the grid on metal levels M2 and M4 at x=43.2 μm and 86.4 μm. Extraction results were obtained for three different power-ground decoupling states shown in FIG. 12C. Referring to FIG. 12C, in the no decoupling state the power and ground distribution lines are shorted only at the two black rectangular regions. In the minimal decoupling state, the power and ground grid lines are shorted at intersections denoted by an "X" in FIG. 12C. In the complete decoupling state, the power and grid lines are shorted at intersections marked with a circle. Shorts are chosen rather than capacitors to facilitate a direct comparison with the Fasthenry inductance extraction program.

Figure 13A:
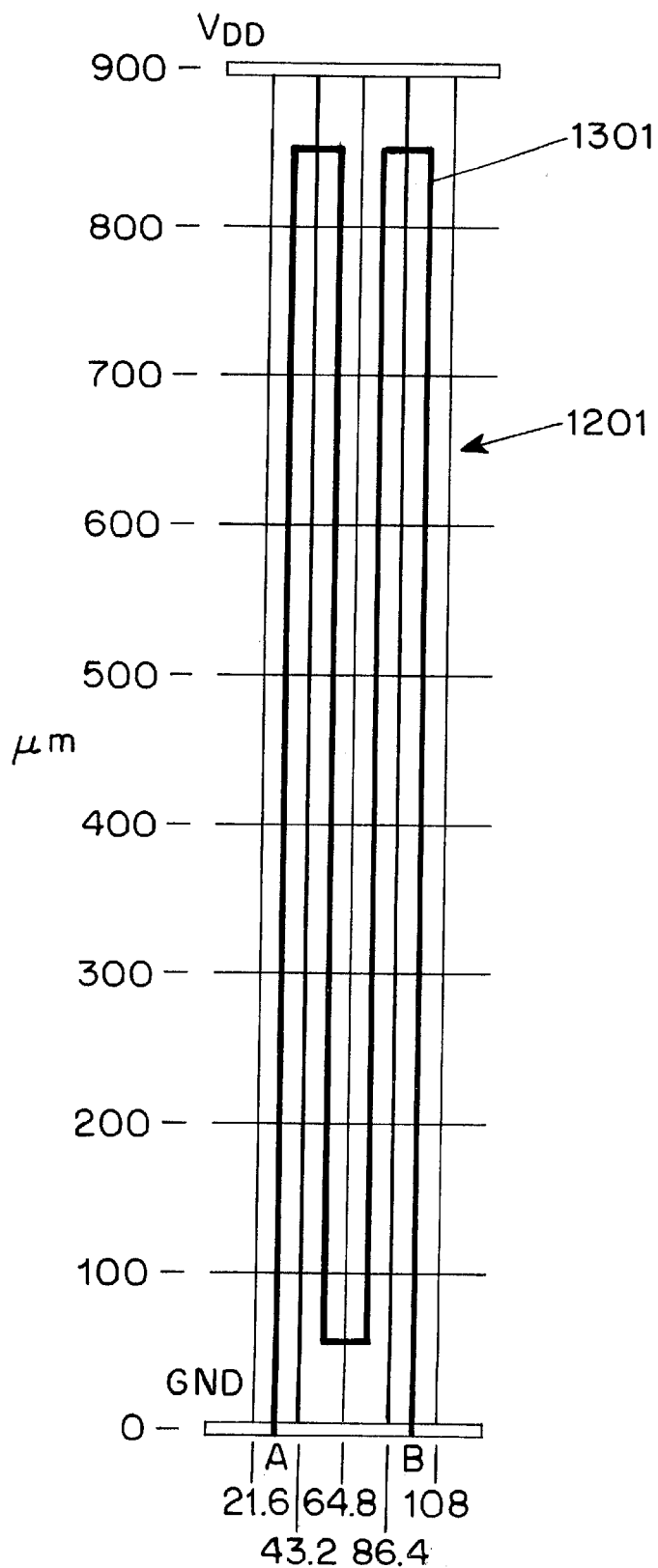
FIG. 13A is a plan view showing a single signal line beginning at node A and ending at node B routed within the power and ground distribution grid of FIG. 12B, node B being shorted to the power grid at the far end.
Figure 13B:
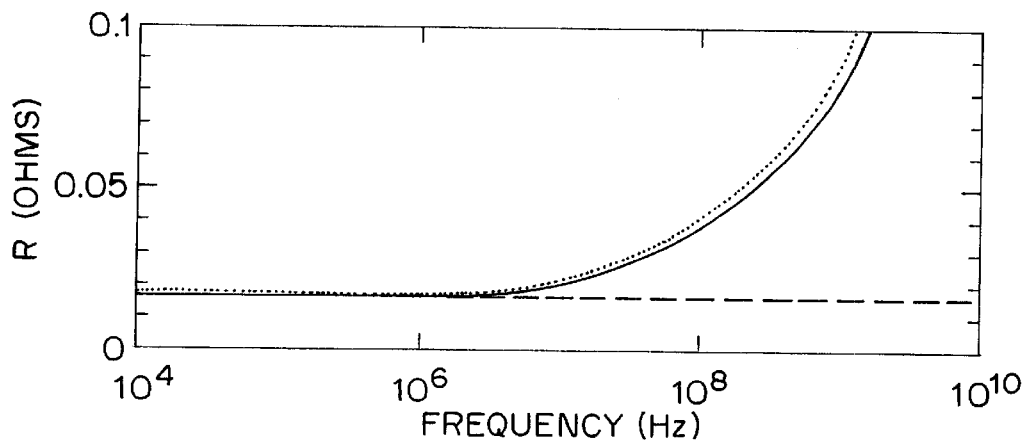
FIG. 13B is graph of the resistance at the near end of the single signal line of FIG. 13A versus frequency, as computed using the return-limited extraction of the present invention (dashed curve) and computed using the Fasthenry inductance extraction program for the complete decoupling case of FIG. 12C (solid curve) and for the no decoupling case of FIG. 12C (dotted curve)

Turning to FIG. 13A, there is shown a plan view of a single signal line segment 1301, which begins at node A and ends at node B, routed within the power and ground distribution network 1201 of FIG. 12B. Node B is shorted to the power grid at the far end. Referring to FIGS. 13A and 13B, there are shown graphs of the resistance and inductance of the signal line segment 1201, respectively, as a function of frequency. The dashed curves are the results of calculations using the return-limited extraction of the present invention, while the solid curves are the results of calculations using the Fasthenry inductance extraction program for the case of complete decoupling between power and ground. The dotted curves in FIGS. 13A and 13B are the results of calculations with Fasthenry for the case of no decoupling. It is noted that the inductance calculated with Fasthenry for the no decoupling state exceeds the inductance for the complete decoupling case at all frequencies spanned by the horizontal axis of the graph of FIG. 13B. This is because in the no decoupling state more distant high frequency current returns are needed.

Figure 13C:
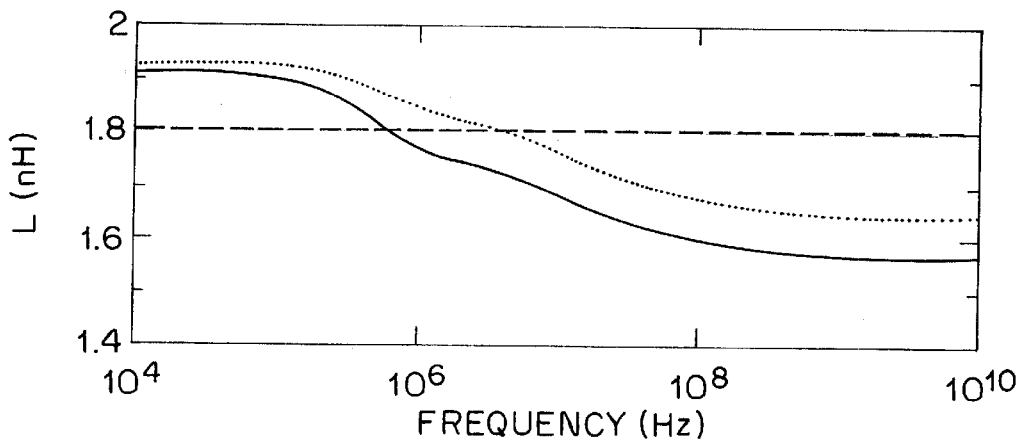
FIG. 13C is a graph of the inductance at the near end of the signal line of FIG. 13A versus frequency, as computed using the return-limited extraction of the present invention (dashed curve), and computed using the Fasthenry inductance extraction program for the complete decoupling case of FIG. 12C (solid curve) and for the no decoupling case of FIG. 12C (dotted curve)
Figure 13D:
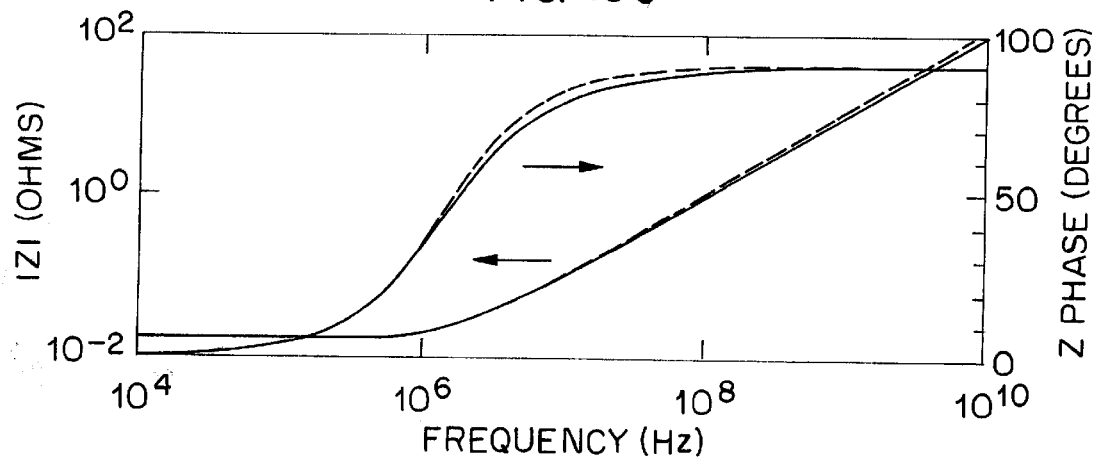
FIG. 13D is a graph of the magnitude and phase of the impedance at the near end of the signal line of FIG. 13A versus frequency, as computed using the return-limited extraction of the present invention (dashed curves), and computed using the Fasthenry inductance extraction program for the complete decoupling case of FIG. 12C (solid curves) and for the no decoupling case of FIG. 12C (dotted curves)

Two off-setting factors contribute to the accuracy of the return-limited inductance values. The first factor is that more distant parallel return paths are not considered, which, as explained hereinabove, results in a slight overestimation of the inductance. The second counter balancing factor is the elimination of mutual inductances between sections of the same signal line that fall into different interaction regions, which results in a slight underestimation of the inductance. In the configuration of FIG. 13A, the frequency dependence of the resistance of the signal line segment 1301 does not become important until frequencies at which the impedance of the signal line 1301 segment is dominated by its inductance. As a result, FIG. 13D shows that there is good agreement in both the magnitude and phase of the near end impedance of the signal line segment 1301 between the results calculated using the return-limited extraction of the present invention, shown as the dashed curves, and the results calculated with the Fasthenry for the case of complete decoupling between power and ground, shown as the solid curves.

Figure 14A:
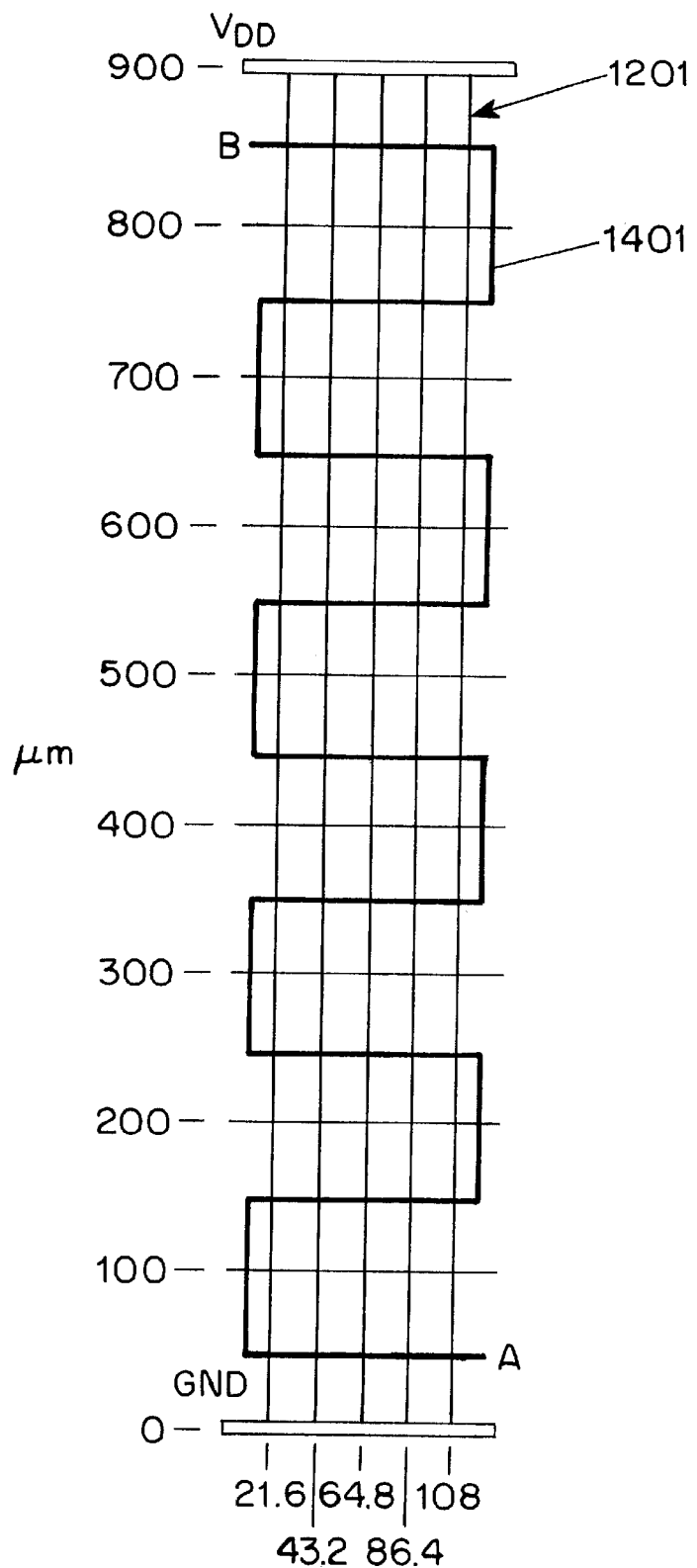
FIG. 14A is a plan view showing a single signal line beginning at node A and ending in node B routed within the power and ground distribution grid of FIG. 12B, where node B is shorted to the power grid at the far end and the complete decoupling case of FIG. 12C is applied.
Figure 14B:
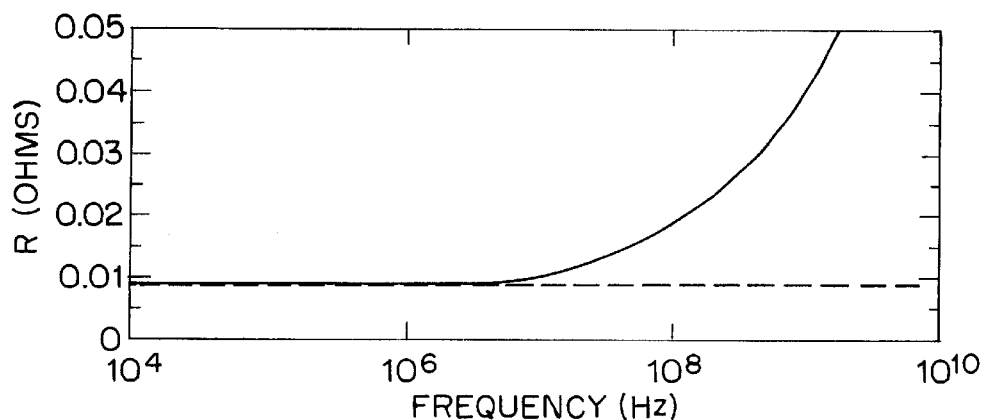
FIG. 14B is a graph of the resistance at the far end of the signal line of FIG. 14A versus frequency, as computed using the return-limited extraction of the present invention (dashed curve) and computed using the Fasthenry inductance extraction program (solid curve)
Figure 14C:
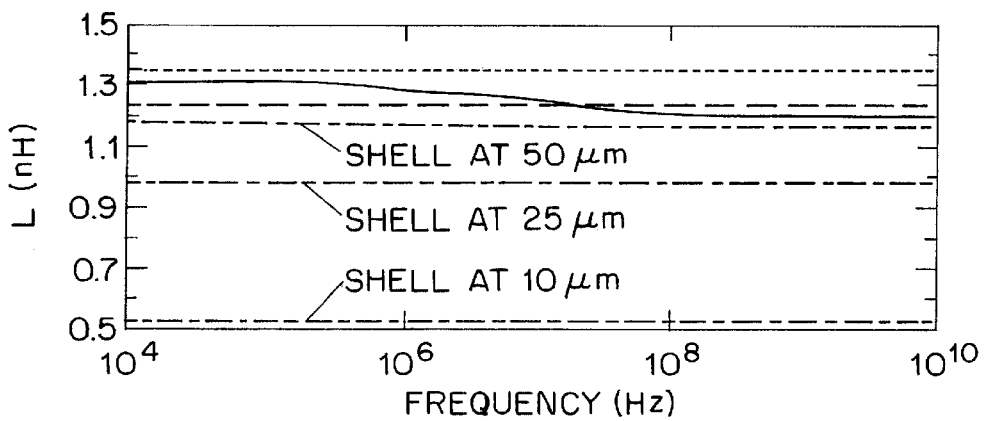
FIG. 14C is a graph of the inductance at the near end of the signal line of FIG. 14A versus frequency, as computed using the return-limited inductance extraction of the present invention (dashed curve), computed using the Fasthenry inductance extraction program (solid curve), computed using return-limited inductance extraction of the present invention with enlarged horizontal interaction regions to preserve more mutual couplings (dotted curve), and computed using the shell sparsification technique on the partial inductive matrix for shell radii $r_0$ of 50 μm, 25 μm and 10 μm (dashed-dotted curves)
Figure 14D:
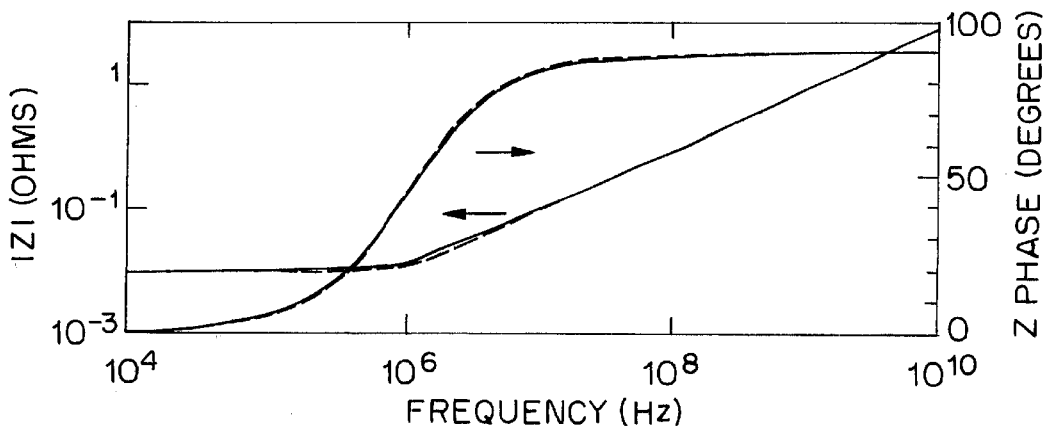
FIG. 14D is a graph of the magnitude and phase of the impedance at the near end of the signal line of FIG. 14A versus frequency, as computed using the return-limited inductance extraction of the present invention (dashed curves) and computed using the Fasthenry inductance extraction program (the solid curves)

Turning to FIG. 14A there is shown a plan view of a signal line 1401, which begins at node A and ends at node B, routed through the power and ground distribution network 1201 of FIG. 12B. Node B is shorted to the power grid at the far end. In FIGS. 14B and 14C there are shown graphs of the resistance and inductance of the signal line 1401, respectively, versus frequency, as calculated using the return-limited extraction of the present invention and as calculated with the Fasthenry program. The results obtained with return-limited extraction are shown as dashed curves, while the results obtained with Fasthenry for the complete decoupling state is shown as the solid curves. It is noted in FIG. 14C that the return-limited inductance extraction tends to underestimate the inductance more than in the case of FIG. 13C. This is because in the routing of the signal line 1401 shown in FIG. 14A there are more distant parallel return paths for the horizontal segments of the signal line 1401. Consequently, the eliminated forward mutual inductances play a more significant role. To demonstrate this, the return-limited inductance extraction calculation was carried out for the signal line routing arrangement of FIG. 14A with the sizes of the horizontal interaction regions doubled to include more forward mutual inductances. The results are shown in the dotted curve of FIG. 14C. In FIG. 14D there is shown a graph of the magnitude and phase of the near end driving point impedance of the signal line 1401 versus frequency, as calculated using the return-limited extraction of the present invention, and as calculated the Fasthenry inductance extraction program. As may be seen from the graph of FIG. 13D, the results obtained using return-limited extraction shown as the dotted curves in the figure and the results obtained with Fasthenry shown as the solid curves in the figure are in good agreement. Also shown in FIG. 14C are dashed-dotted curves representing the results of calculations of the inductance of signal line 1401 versus frequency using the aforementioned shell sparsification technique on the partial inductance matrix for shell radii of 50 $\mu$m, 25 $\mu$m and 10 $\mu$m. The result for $r_0=10$ $\mu$m is far worse than the return-limited inductance extraction result even though it required 859 non-zero elements as compared to only 178 non-zero elements for the return-limited inductance matrix. Good accuracy is not achieved until $r_0=50$ $\mu$m, requiring over 3000 elements in the partial inductance matrix. Furthermore, there is no way of knowing a priori what value of $r_0$ is required to achieve acceptable accuracy. The full partial inductance matrix for the interconnect configuration of FIG. 14A, even with only single filament decomposition, has more than 80,000 non-zero elements.

Turning to FIG. 15, there is shown a more complex example in which two signal lines 1501 and 1502 are routed within the power and ground distribution network 1201 of FIG. 12A. Signal line 1501 begins at node A and ends at node D, while signal line 1502 begins at node C and ends at node B. Nodes B and D are shorted at the far end to the power grid, and the complete decoupling state of FIG. 12C is assumed. In FIG. 15B there is shown a graph of resistance versus frequency, as calculated using the return-limited extraction of the present invention and with the Fasthenry program. The results obtained using return-limited extraction are shown as the dashed curves, while the results obtained using the Fasthenry program are shown as the solid curves. In FIG. 15B, $R_{11}$ denotes the resistance at port A defined by node A and the adjacent near end power grid, and $R_{22}$ denotes the resistance at port B defined by node B and the adjacent near end power grid. In the same figure, $R_{12}$ denotes the coupling resistance between ports A and B. Referring to FIG. 15C, there is shown a graph of the inductance at the near end versus frequency, as calculated using the return-limited inductance extraction of the present invention, and calculated using the Fasthenry program. The results obtained using return-limited inductance extraction are shown by the dashed curves, while the results obtained using the Fasthenry program are shown as the solid curves. In FIG. 15C, $L_{11}$ denotes the inductance at port A defined above, and $L_{22}$ denotes the inductance at port B defined above. In the same figure, $L_{12}$ denotes the coupling inductance between ports A and B. Turning to FIG. 15D, there are shown graphs of the magnitude and phase of the impedance at the near end versus frequency, as calculated using the return-limited extraction of the present invention, and as calculated using the Fasthenry program. The results obtained using the return-limited extraction are shown as the dashed curves in the graphs, while the results obtained using the Fasthenry program are shown as the solid curves in the graphs. In the graphs of FIG. 15D, $Z_{11}$ denotes the impedance at port A defined above, and $Z_{22}$ denotes the impedance at port B defined above. In the same figure, $Z_{12}$ denotes the coupling impedance between ports A and B. Once again, the results obtained using the return-limited extraction of the present invention compare favorably with the results obtained using the Fasthenry Program.

TABLE I

Figure 15A:
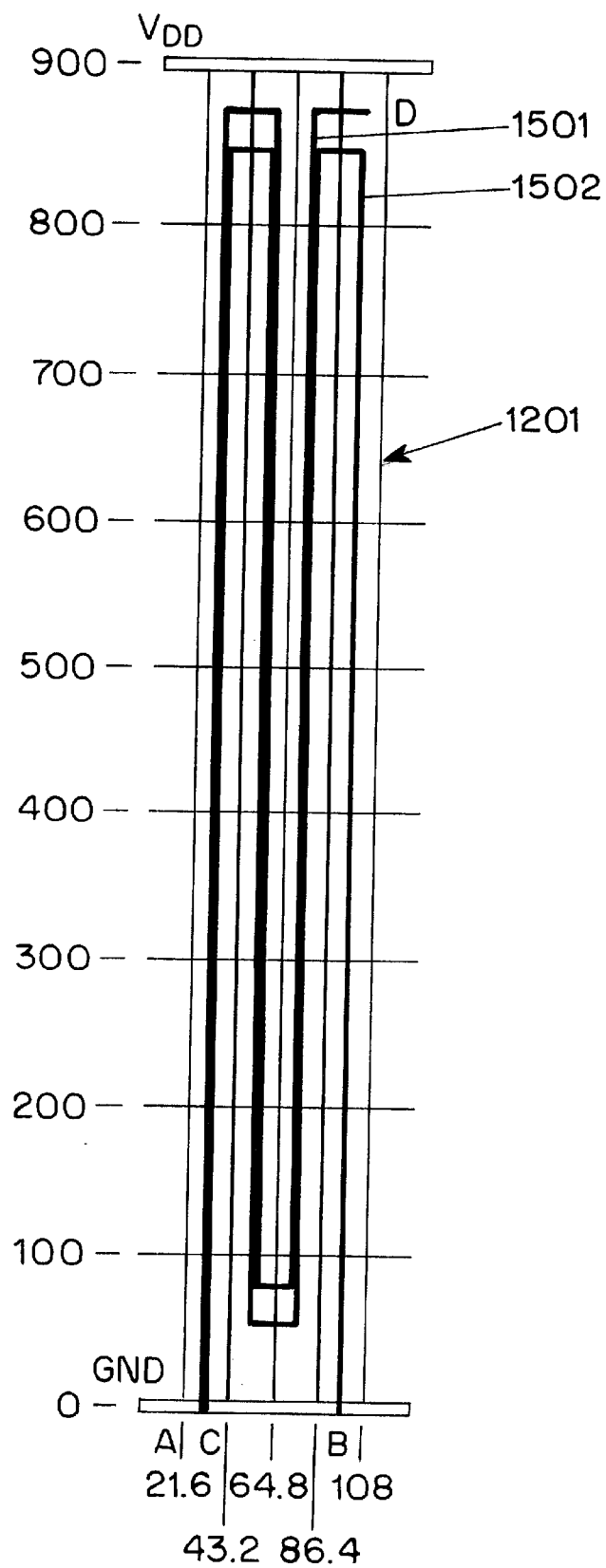
FIG. 15A is a plan view showing two signal lines, one beginning at node A and ending at node D and the other beginning at node C and ending at node B, routed within the power and ground distribution grid of FIG. 12B, nodes B and D being shorted at the far end to the power grid and the complete decoupling state of FIG. 12C being applied.
Figure 15B:
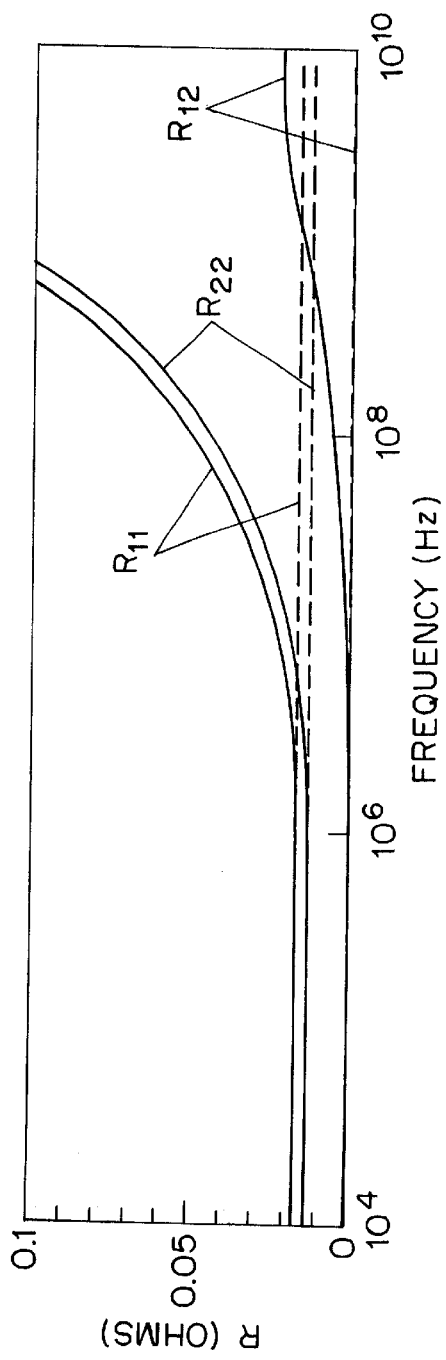
FIG. 15B is a graph of the resistance at the near end of the signal lines of FIG. 15A versus frequency, as computed using the return-limited extraction of the present invention (dashed curves) and computed using the Fasthenry inductance extraction program (solid curves), where $R_{11}$ denotes the resistance at port A, $R_{22}$ denotes the resistance at port B and $R_{12}$ denotes the coupling resistance between ports A and B.
Figure 15C:
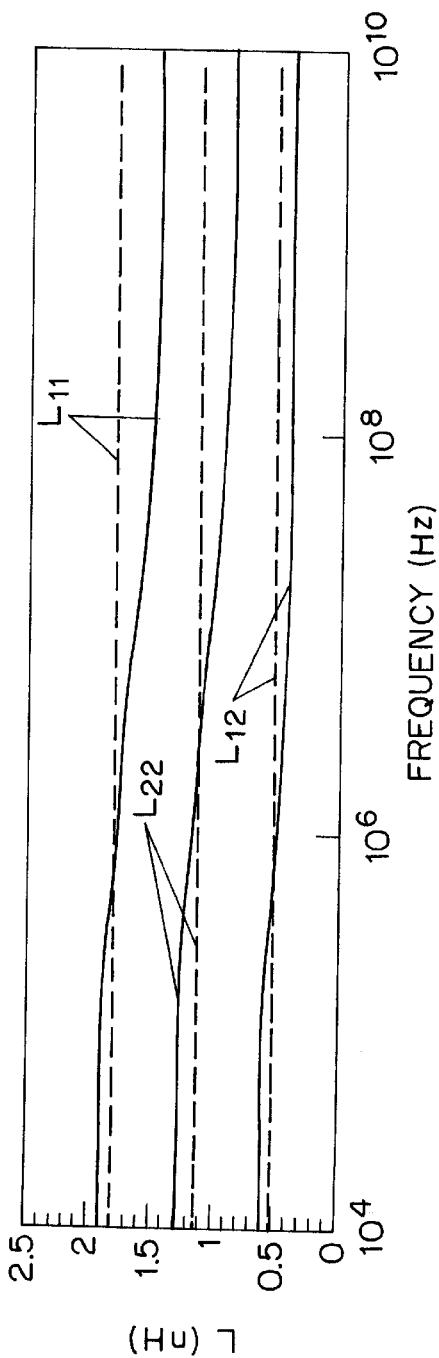
FIG. 15C is a graph of the inductance at the near end of the signal lines of FIG. 15A versus frequency, as computed using the return-limited extraction of the present invention (dashed curves) and computed using the Fasthenry inductance extraction program (solid curves), where $L_{11}$ denotes the inductance at port A, $L_{22}$ denotes the inductance at port B and $L_{12}$ denotes the coupling inductance between the ports A and B.
Figure 15D:
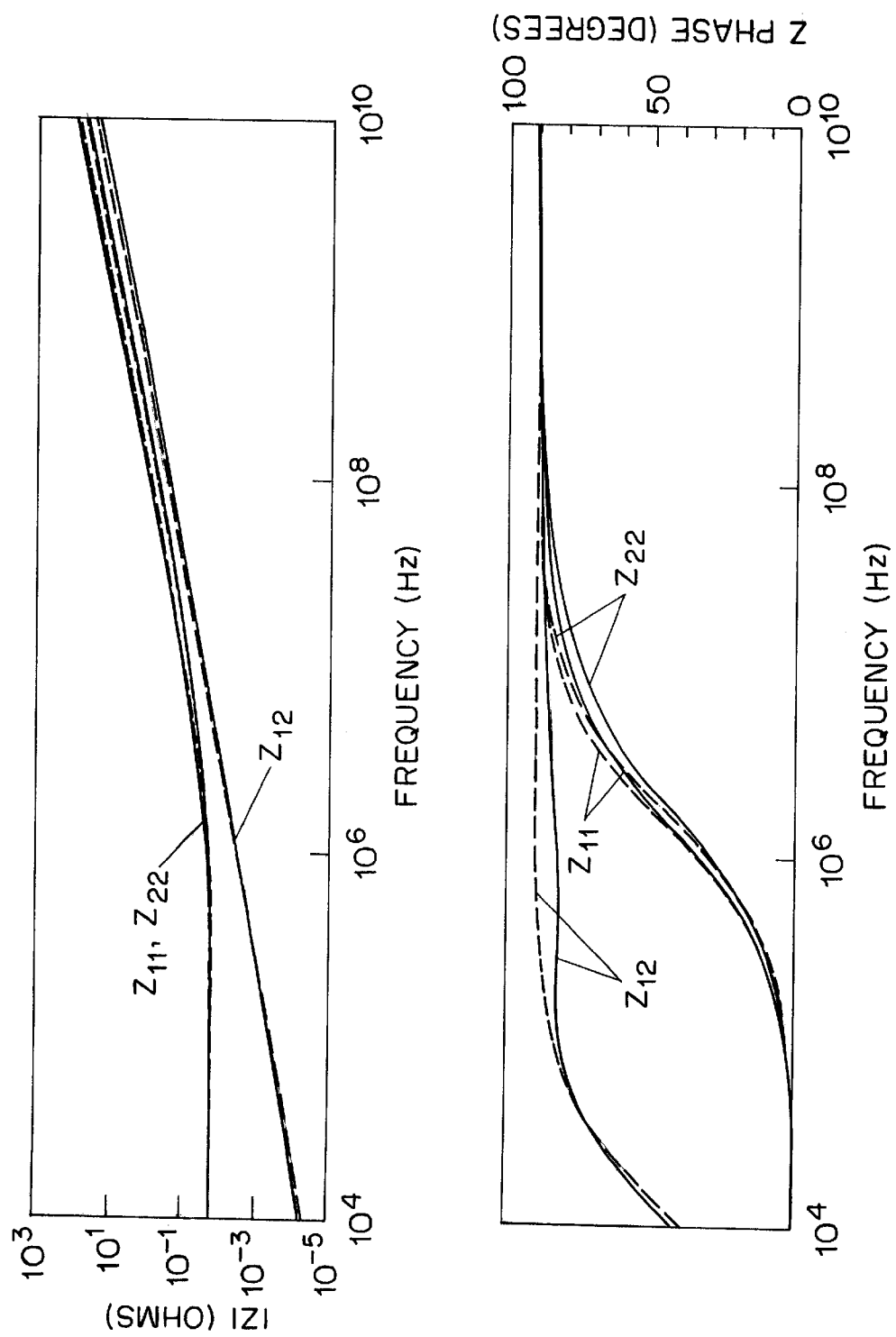
FIG. 15D is a graph of the magnitude and phase of the impedance at the near end of the signal lines of FIG. 15A versus frequency, as computed using the return-limited extraction of the present invention (dashed curves) and computed using the Fasthenry inductance extraction program (solid curves), where $Z_{11}$ denotes the impedance at port A, $Z_{22}$ denotes the impedance at port B and $Z_{12}$ denotes the coupling impedance between the ports A and B.

| Network | One filament per segment | 20 filaments per segment | Shell at 50 μm | Shell at 25 μm | Shell at 10 μm | Return-limited |
|---|---|---|---|---|---|---|
| FIG. 13A | 69201 | 27680400 | 3297 | 1297 | 465 | 132 |
| FIG. 14A | 82137 | very big | 3075 | 1427 | 859 | 178 |
| FIG. 15A | 117069 | very big | 6103 | 2513 | 681 | 597 |

Table I shows a comparison of the number of nonzero elements in the inductance matrix for the return-limited inductance extraction against the full partial inductance extraction, and against various applications of the shell sparsification technique. The number of nonzero elements provides a direct measure of the efficiency of simulation and analysis of the respective networks. The full partial inductance extraction is shown in Table I under two conditions, one being that a single filament is used to represent each segment, and the other being each segment cross section is divided into 20 filaments. The results obtained using the Fasthenry Program shown in FIGS. 13B–D, FIGS. 14B–D and FIGS. 15B–D were calculated using the 20 filament decomposition to properly model the skin effect up to 10 GHz.

While the present invention has been particularly described with reference to exemplary embodiments thereof, it will be understood by those skilled in the art that various modifications and alterations may be made without departing from the spirit and scope of the invention. Accordingly, the disclosed embodiments of the invention are considered merely illustrative, and the invention is limited in scope only as specified in the appended claims.

What is claimed is:

1. In the modeling of an integrated circuit a method for extracting inductances of the interconnections of the integrated circuit which provides a positive semi-definte inductance matrix comprising the steps of:
   a. determining power distribution lines and ground distribution lines of the integrated circuit;
   b. deriving from the power distribution lines and the ground distribution lines of the integrated circuit a plurality of disjointed interaction regions, each interaction region having a respective section of one or more signal lines of the integrated circuit, respective sections of two or more of the power distribution lines and/or the ground distribution lines;
   c. in each interaction region fracturing each section of the one or more signal lines, each section of the power distribution lines and each section of the ground distribution lines in the interaction region into horizontal and vertical segments;
   d. in each interaction region determining a plurality of coupled loop inductances each defined by a current loop passing through a respective one of the signal line segments in the interaction region and returning through a respective parallel and adjacent one of the power distribution line segments and the ground distribution line segments in the interaction region;
   e. in each interaction region eliminating all current loops that do not pass a net current through a signal line segment in the interaction region; and
   f. in each interaction region combining the coupled loop inductances into a reduced set of equivalent inductances that model the inductance of each signal line section in the interaction region.

2. The method of claim 1 further comprising the steps of: comparing the resistance of each signal line of the circuit with the inductive reactance of the signal line, and eliminating any signal lines having a resistance which is substantially larger than the magnitude of the inductive reactance thereof.

3. The method of claim 1, wherein the step of deriving the plurality of disjointed interaction regions comprises the steps of:
   i. defining vertical halos for each one of the power distribution lines and each one of the ground distribution lines of the integrated circuit;
   ii. identifying each region where a vertical halo is blocked by a vertical portion of a signal line;
   iii. defining a vertical interaction region as a region containing all signal line sections where one of the signal line sections can be joined with another one of the signal line sections by a path that does not cross a vertical halo that is not blocked by a vertical portion of a signal line;
   iv. defining horizontal halos for each one of the power distribution lines and each one of the ground distribution lines;
   v. identifying each region where a horizontal halo is blocked by a horizontal portion of a signal line; and
   vi. defining a horizontal interaction region as a region containing all signal line sections where each one of the signal line sections can be joined with another one of the signal line sections by a path that does not cross a horizontal halo that is not blocked by a horizontal portion of a signal line.

4. The method of claim 1, wherein the step of combining the coupled loop inductances into a reduced set of equivalent inductances in each interaction region comprises the steps of:
   i. defining for the interaction region an n×n matrix L' having as elements all of the loop inductances of the interaction region and all mutual couplings among the loop inductances, where n is the number of coupled loop inductances in the interaction region;
   ii. defining for the interaction region an n×m matrix B where m is the number of signal line segments in the interaction region, each column of the matrix B corresponding to a respective signal line segment in the interaction region, each row of the matrix B corresponding to a respective loop inductance in the interaction region, the elements of the matrix B in each column being zero except for 1's in rows corresponding to loop inductances defined by current loops passing through the signal line segment corresponding to the column; and iii. deriving for the interaction region an m×m matrix L having as elements the reduced set of equivalent inductances by using the relation $L = (B^T L'^{-1} B)^{-1}.$

5. The method of claim 4, further comprising combining the matrix L for each one of the interaction regions to derive an inductance matrix for the entire integrated circuit, wherein the inductance matrix for the entire integrated circuit is block diagonal with each block representing the horizontal or vertical signal line segments of a respective one of the plurality of interaction regions.

6. The method of claim 1, wherein the fracturing step comprises:

i. projecting each fracture of the power distribution line sections and the ground distribution line sections in the interaction region onto the signal line sections in the interaction region; and ii. projecting each fracture of each signal line section in the interaction region onto the power distribution line sections and the ground distribution line sections in the interaction region.

\* \* \* \* \*

UNITED STATES PATENT AND TRADEMARK OFFICE
CERTIFICATE OF CORRECTION

PATENT NO. : 6,453,444 B1
DATED : September 17, 2002
INVENTOR(S) : Kenneth L. Shepard It is certified that error appears in the above-identified patent and that said Letters Patent is hereby corrected as shown below:

Column 1,
Line 9, insert -- The present invention was made under National Science Foundation Grant No. CCR-97-34216. The U.S. Government may have certain rights in the invention --

Column 4,
Line 61, "cross sectional" should read -- cross-sectional --

Column 5,
Lines 1, 12 and 16, "cross sectional" should read -- cross-sectional --
Line 57, "dahsed" should read -- dashed --

Column 6,
Line 20, "cross sectional" should read -- cross-sectional --
Line 54, "L,$_{12}$" should read -- L$_{12}$ --

Column 9,
Line 18, "parallelopiped" should read -- parallelepiped --
Line 66, "cross sectional" should read -- cross-sectional --

Column 11,
Line 44, "colinear" should read -- collinear --

Column 14,
Line 25, "cross sectional" should read -- cross-sectional --
Line 26, "a$_i$," should read -- a$_i$ --
Line 59, "colinear" should read -- collinear --

Column 15,
Equation (11):

"$[l\log_e l + \frac{m}{l} + m\log_e l + \frac{m}{m}]$." should read -- $[l\log_e \frac{l+m}{l} + m\log_e \frac{l+m}{m}]$. --

UNITED STATES PATENT AND TRADEMARK OFFICE
CERTIFICATE OF CORRECTION

PATENT NO. : 6,453,444 B1
DATED : September 17, 2002
INVENTOR(S) : Kenneth L. Shepard It is certified that error appears in the above-identified patent and that said Letters Patent is hereby corrected as shown below:

Column 15 cont'd,
Line 5, "cross sectional" should read -- cross-sectional --
Line 11, "$r_{11}$," should read -- $r_{11'}$ --
Equation (12): "$\log_e r_{11}$," should read -- $\log_e r_{11'}$ --
Equation (13): "$\log_e r_{2'hd\ 1}$" should read -- $\log_e r_{2'1'}$ --
Equation (14): "$\log_e r_{11}$." should read -- $\log_e r_{11}$. --
Equation (16): "$\log_e r_{3'2}$[overstrike]" should read -- $\log_e r_{3'2''}$)/6. (16) --
Line 44, "colinear" should read -- collinear --
Line 58, "MHZ." should read -- MHz. --

Column 16,
Lines 26-27, "publically" should read -- publicly --
Line 43, "fc," should read -- $f_c$, --

Column 21,
Line 54, "semi-definte" should read -- semi-definite --

Column 23,
Line 8, "$L=(B^T L^{-1} B)^{-1}$." should read -- $L=(B^T L^{-1} B)^{-1}$. --

Signed and Sealed this

Eighteenth Day of February, 2003

JAMES E. ROGAN
*Director of the United States Patent and Trademark Office*

UNITED STATES PATENT AND TRADEMARK OFFICE
CERTIFICATE OF CORRECTION

PATENT NO.          : 6,453,444 B1
APPLICATION NO.     : 09/496805
DATED               : September 17, 2002
INVENTOR(S)         : Kenneth L. Shepard Page 1 of 1

It is certified that error appears in the above-identified patent and that said Letters Patent is hereby corrected as shown below:

On page 1, Column 1, line 9, please insert the following header and paragraph:

--Statement Regarding Federally Sponsored Research or Development
This invention was made with government support under grant number CCR9734216 awarded by the National Science Foundation. The government has certain rights in the invention.--

Signed and Sealed this
Twentieth Day of November, 2012

David J. Kappos
*Director of the United States Patent and Trademark Office*